US008812141B2

(12) United States Patent
Kim et al.

(10) Patent No.: US 8,812,141 B2
(45) Date of Patent: *Aug. 19, 2014

(54) SYSTEM, MEDIUM AND METHOD OF ENCODING/DECODING MULTI-CHANNEL AUDIO SIGNALS

(75) Inventors: Junghee Kim, Seoul (KR); Mino Lei, Yongin-si (KR); Eunmi Oh, Seongnam-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 170 days.

This patent is subject to a terminal disclaimer.

(21) Appl. No.: 13/137,292

(22) Filed: Aug. 3, 2011

(65) Prior Publication Data

US 2011/0293099 A1 Dec. 1, 2011

Related U.S. Application Data

(63) Continuation of application No. 11/602,278, filed on Nov. 21, 2006, now Pat. No. 8,280,538.

(60) Provisional application No. 60/738,049, filed on Nov. 21, 2005.

(30) Foreign Application Priority Data

Apr. 3, 2006 (KR) .......................... 10-2006-0030249

(51) Int. Cl.
*G06F 17/00* (2006.01)

(52) U.S. Cl.
USPC .................. 700/94; 381/17; 704/E19.005

(58) Field of Classification Search
None
See application file for complete search history.

(56) References Cited

U.S. PATENT DOCUMENTS 5,594,800 A  1/1997  Gerzon ........................... 381/20
5,850,456 A  12/1998  Ten Kate et al.
5,878,080 A  3/1999  Ten Kate
(Continued)

FOREIGN PATENT DOCUMENTS

CN  1223064  7/1999
CN  1228236  9/1999
(Continued)

OTHER PUBLICATIONS

U.S. Notice of Allowance mailed Feb. 2, 2012 corresponds to U.S. Appl. No. 11/602,278.
(Continued)

*Primary Examiner* — Andrew C Flanders
*Assistant Examiner* — David Siegel
(74) *Attorney, Agent, or Firm* — Staas & Halsey LLP

(57) ABSTRACT

An system, method, and method of encoding/decoding a multi-channel audio signal, including a decoding level generation unit producing decoding-level information that helps a bitstream including a number of audio channel signals and space information to be decoded into a number of audio channel signals, wherein the space information includes information about magnitude differences and/or similarities between channels, and an audio decoder decoding the bitstream according to the decoding-level information. Accordingly, even a single input bitstream can be decoded into a suitable number of channels depending on the type of a speaker configuration used. Scalable channel decoding can be achieved by partially decoding an input bitstream. In the scalable channel decoding, a decoder may set decoding levels and outputs audio channel signals according to the decoding levels, thereby reducing decoding complexity.

5 Claims, 18 Drawing Sheets

(56) References Cited

U.S. PATENT DOCUMENTS

| | | | |
|---|---|---|---|
| 5,970,152 | A | 10/1999 | Klayman |
| 6,160,953 | A | 12/2000 | Fuchigami et al. |
| 6,438,525 | B1 | 8/2002 | Park |
| 6,741,965 | B1 | 5/2004 | Shimoyoshi et al. |
| 7,283,634 | B2 | 10/2007 | Smith .................. 381/20 |
| 8,280,538 | B2* | 10/2012 | Kim et al. .............. 700/94 |
| 2002/0006081 | A1 | 1/2002 | Fujishita |
| 2005/0226426 | A1 | 10/2005 | Oomen et al. |
| 2006/0009985 | A1 | 1/2006 | Ko et al. |
| 2006/0206323 | A1 | 9/2006 | Breebaart ............. 704/230 |
| 2008/0255857 | A1* | 10/2008 | Pang et al. ............ 704/500 |
| 2011/0044459 | A1* | 2/2011 | Pang et al. ............ 381/22 |

FOREIGN PATENT DOCUMENTS

| | | |
|---|---|---|
| CN | 1669359 | 9/2005 |
| EP | 0 924 962 | 6/1999 |
| JP | 10-322689 | 12/1998 |
| JP | 2000-236599 | 8/2000 |
| JP | 2002-236599 | 8/2000 |
| JP | 2001-352599 | 12/2001 |
| JP | 2003-102100 | 4/2003 |
| KR | 1020040102163 A | 12/2004 |
| WO | WO2004008805 A1 | 1/2004 |
| WO | WO2005/098821 | 10/2005 |

OTHER PUBLICATIONS

U.S. Appl. No. 11/602,278, filed Nov. 21, 2006, Junghoe Kim et al., Samsung Electronics CO. LTD.

Chinese Decision of Rejection dated Nov. 1, 2011 corresponds to Chinese Patent Application No. 20068004.416.5.

ISO/IEC JTC 29 WG 11(MPEG); "Information Technology—Coding of Audio-Visual Objects—Part x: Spatial Coding" (2005), XP002390780.

J. Breebaart et al., "MPEG Spatial Audio Coding/MPEG Surround Overview and Current Status", Audio Engineering Society: Convention Paper, 119$^{th}$ Convention, New York, Oct. 10, 2005.

Herre J. et al; "The Reference Model Architecture for MPEG Spatial Audio Coding" Audio Engineering Society Convention paper, New York, NY, US, No. 6447, May 28, 2005 pp. 1-13 XP002365270.

Extended European Search report Issued Apr. 13, 2011 Corresponds to European Patent Office Application No. 11002045.0.

Chinese Office Action issued Aug. 5, 2010 corresponds to Chinese Patent Application 200680043416.5.

Chinese Office Action issued Mar. 1, 2010 corresponds to Chinese Patent Application 200680043416.5.

European Search Report issued Nov. 6, 2008 in corresponding European Patent Application 06812653.1.

International Search Report for Corresponding PCT Application No. PCT/KR2006/004890.

U.S. Notice of Allowance mailed May 2, 2011 issued to Parent U.S. Appl. No. 11/602,278.

Advisory Action mailed Jan. 6, 2011 issued to Parent U.S. Appl. No. 11/602,278.

Final Office Action mailed Jul. 8, 2010 issued to Parent U.S. Appl. No. 11/602,278.

Office Action mailed Oct. 5, 2009 issued to Parent U.S. Appl. No. 11/602,278.

U.S. Notice of Allowance mailed May 10, 2012 in co-pending U.S. Appl. No. 11/602,278.

European Decision of Refuse dated Feb. 15, 2012 corresponds to European Patent Application No. 06 812 653.1-1228.

European Provision of the minutes of an oral hearing, dated Feb. 15, 2012, also corresponding to European Patent Application No. 06 812 653.1-1228.

European Decision to Refuse dated May 3, 2013 from European Patent Application No. 11002044.3.

European Decision to Refuse dated Jun. 27, 2013 from European Patent Application No. 11002045.0.

Japanese Office Action dated Jun. 25, 2013 from Japanese Patent Application No. 2011-256425.

Japanese Office Action dated Apr. 23, 2013 from Japanese Patent Application No. 2008-541085.

Korean Office Action mailed Feb. 14, 2008 from Korean Patent Application No. 10-2006-0030249, 8 pages.

Japanese Office Action mailed May 24, 2011 from Japanese Patent Application No. 2008-541085, 4 pages.

Japanese Office Action mailed Jul. 10, 2012 from Japanese Patent Application No. 2008-541085, 4 pages.

Korean Notice of Allowance mailed Jan. 30, 2009 from Korean Patent Application No. 10-2006-0030249, 6 pages.

Japanese Office Action dated Feb. 5, 2013 in Japanese Application No. 2011-256425.

Office Action dated Dec. 20, 2013 from European Patent Application No. 11002045.0, 5 pages.

Chinese Office Action dated Feb. 8, 2014 from Chinese Patent Application No. 201210191302.2, 13 pages.

Chinese Office Action dated Feb. 8, 2014 from Chinese Patent Application No. 201210191747.0, 13 pages.

Chinese Office Action dated Feb. 8, 2014 from Chinese Patent Application No. 201210191134.7, 14 pages.

Chinese Office Action dated Feb. 8, 2014 from Chinese Patent Application No. 201210191191.5, 13 pages.

Chinese Office Action dated Feb. 8, 2014 from Chinese Patent Application No. 201210190880.4, 13 pages.

U.S. Office Action mailed Jun. 17, 2014 in co-pending U.S. Appl. No. 13/599,147, 21 pages.

Office Action (Notice of Reasons for Final Rejection), issued Jun. 3, 2014 in corresponding Japanese Patent Application No. 2011-256425 (4 pages).

* cited by examiner

SYSTEM, MEDIUM AND METHOD OF ENCODING/DECODING MULTI-CHANNEL AUDIO SIGNALS

CROSS-REFERENCE TO RELATED APPLICATIONS

This application is a continuation of application Ser. No. 11/602,278 filed on Nov. 21, 2006 now U.S. Pat. No. 8,280,538, which claims the priority of Korean Patent Application No. 10-2006-0030249, filed on Apr. 3, 2006, in the Korean Intellectual Property Office, and the benefit of U.S. Provisional Patent Application No. 60/738,049, filed on Nov. 21, 2005, in the U.S. Patent and Trademark Office, the disclosures of which are incorporated herein in their entirety by reference.

BACKGROUND OF THE INVENTION

1. Field of the Invention

An embodiment of the present invention relates to the encoding and/or decoding of audio signals, and more particularly, to a system, medium, and method encoding/decoding a multi-channel audio signal.

2. Description of the Related Art

Examples of a general audio coding include a waveform multi-channel audio coding and a parametric multi-channel audio coding. In the waveform multi-channel audio coding, 5 audio channel signals may be received and 5 audio channel signals may be output. Examples of the waveform multi-channel audio coding include an MPEG-2 MC audio coding, an AAC MC audio coding, and a BSAC/AVS MC audio coding, for example. The MPEG-2 MC audio coding is executed in two types of modes, one of which is a mode operated on original signals and the other is a mode operated on-two downmixed signals and other independent signals, the AAC MC audio coding is executed on original signals with PCE and default settings, and the BSAC/AVS MC is a bit sliced arithmetic audio coding executed on original signals with channel_configuration_idx.

An example of the parametric multi-channel audio coding includes an MPEG surround coding that decodes 1 or 2 input channel signals into 5 or 6 channel signals. In addition, the MPEG surround coding is based on Quant Matrix Extention (QMF), a reverse one-input to two-output decoding tool (R-OTT), a reverse two-input to three-output decoding tool (R-TTT), and a R-OTT tree regarding extended signals. Here, as an example, a one-input to two-output tool is a tool that takes one input and generates two outputs.

FIG. 1 illustrates such an MPEG surround decoder. There are various speaker configurations at the receiver sides of decoders, for example, 1, 2, 3 (front)/0(rear), 3/1, 3/2, and 5/2. Hence, the input encoded audio bitstream can be decoded into all available audio channel signals which can be selectively chosen for output depending on the speaker configuration used at the receiver side of a decoder.

Similarly, FIG. 2 illustrates a corresponding encoder for encoding the input audio channel signal into the audio bitstream and a decoder for decoding the encoded audio channel signal. In the case of MPEG surround, the encoder encodes M input audio channel signals and outputs N audio channel signals, as the audio bistream, with M being greater than N. The decoder may then decode the N encoded audio channel signals and output L decoded audio channel signals, with L being greater than or equal to N, and M being greater than or equal to L.

However, in such conventional decoders, the L audio channel signals are directly generated by decoding M input audio channel signals (e.g., when M=N=L) or by an upmixing of downmixed M input audio channel signals into N audio channel signals and then decoding the N audio channel signals. However, it is difficult to decode input audio channel signals into audio signals of a suitable number of channels based on the actual known type of a speaker configuration at the receiver.

SUMMARY OF THE INVENTION

An embodiment of the present invention provides a system, medium, and method of encoding/decoding a multi-channel audio signal, by which input audio channel signals are selectively decoded into audio signals of a suitable number of channels depending on the type of speaker configuration at the receiver side of the decoder based on a selective level of decoding.

Additional aspects and/or advantages of the invention will be set forth in part in the description which follows and, in part, will be apparent from the description, or may be learned by practice of the invention.

To achieve at least the above and/or other aspects and advantages, embodiments of the present invention include a multi-channel audio signal decoding system, including a decoding level generation unit to generate decoding-level information to control a level of decoding of a bitstream having a predetermined number N of encoded audio channel signals and space information into a number L (where $L \geq N$) of audio channel signals, wherein the space information includes information of magnitude differences and/or similarities between corresponding channels, and an audio decoder to selectively decode, through different levels of decoding, the bitstream based on the decoding-level information and to generate the number L of audio channel signals.

To achieve at least the above and/or further aspects and advantages, embodiments of the present invention include a multi-channel audio signal decoding method, including selectively decoding a bitstream based upon decoding-level information to control a level of decoding of the bitstream having a predetermined number N of encoded audio channel signals and space information into a number L of audio channel signals, wherein the space information includes information of magnitude differences and/or a similarities between corresponding channels.

To achieve at least the above and/or still further aspects and advantages, embodiments of the present invention include a multi-channel audio signal decoding system, including a first OTT decoder to decode a single audio channel signal and space information, with a corresponding bitstream including a corresponding encoded single audio channel signal, into two audio channel signals, wherein the space information includes information of magnitude differences and/or similarities between corresponding channels, a TTT decoder to decode the two audio channel signals into three audio channel signals, as first, second, and third channel signals, a second OTT decoder to decode the first channel signal into a first plural channel signals, a third OTT decoder to decode the second channel signal into a second plural channel signals, and a fourth OTT decoder to decode the third channel signal into a third plural channel signals.

To achieve at least the above and/or other aspects and advantages, embodiments of the present invention include a multi-channel audio signal decoding method, including a first OTT decoding of a single audio channel signal and space information, with a corresponding bitstream including a corresponding encoded single audio channel signal, into two audio channel signals, wherein the space information includes information of magnitude differences and/or similarities between corresponding channels, a TTT decoding of the two audio channel signals obtained in the first OTT decoding into three audio channel signals, as first, second, and third channel signals, a second OTT decoding of the first channel signal into a first plural channel signals, a third OTT decoding of the second channel signal into a second plural channel signals, and a fourth OTT decoding of the third channel signal into a third plural channel signals.

To achieve at least the above and/or further aspects and advantages, embodiments of the present invention include a multi-channel audio signal decoding system, including a TTT decoder to decode two audio channel signals and space information, with a corresponding bitstream including corresponding two encoded audio channel signals, into three audio channel signals, as first, second, and third channel signals, wherein the space information includes information of magnitude differences and/or similarities between corresponding channels, a first OTT decoder to decode the first channel signal into a first plural channel signals, a second OTT decoder to decode the second channel signal into a second plural channel signals, a third OTT decoder to decode the third channel signal into a third plural channel signals, a fourth OTT decoder to decode one of the first plural channel signals output by the first OTT decoder into a fourth plural channel signals, and a fifth OTT decoder to decode one of the second plural channel signals output by the second OTT decoder into a fifth plural channel signals.

To achieve at least the above and/or still further aspects and advantages, embodiments of the present invention include a multi-channel audio signal decoding method, including a TTT decoding of two audio channel signals and space information, with a corresponding bitstream includes corresponding two encoded audio channel signals, into three audio channel signals, as first, second, and third channel signals, wherein the space information includes information of magnitude differences and/or similarities between corresponding channels, a first OTT decoding of the first channel signal into a first plural channel signals, a second OTT decoding of the second channel signal into a second plural channel signals, a third OTT decoding of the third channel signal into a third plural channel signals, a fourth OTT decoding of one of the first plural channel signals output in the first OTT decoding into a fourth plural channel signals, and a fifth OTT decoding of one of the second plural channel signals output in the second OTT decoding into a fifth plural channel signals.

To achieve at least the above and/or other aspects and advantages, embodiments of the present invention include a multi-channel audio signal decoding system, including a TTT decoder decoding two audio channel signals and space information, with a corresponding bitstream including corresponding two encoded audio channel signals, into three audio channel signals, as first, second, and third channel signals, wherein the space information includes information of magnitude differences and/or similarities between corresponding channels, a first OTT decoder to decode the first channel signal into a first plural channel signals, a second OTT decoder to decode the second channel signal into a second plural channel signals, a third OTT decoder to decode the third channel signal into a third plural channel signals, a fourth OTT decoder to decode one of the third plural channel signals of the third OTT decoder into a fourth plural channel signals, a fifth OTT decoder to decode one of the fourth plural channel signals of the fourth OTT decoder into the fifth plural channel signals.

To achieve at least the above and/or further aspects and advantages, embodiments of the present invention include a multi-channel audio signal decoding method, including a TTT decoding of two audio channel signals and space information, with a corresponding bitstream including corresponding two encoded audio channel signals, into three audio channel signals, as first, second, and third channel signals, wherein the space information includes information of magnitude differences and/or similarities between corresponding channels, a first OTT decoding of the first channel signal into a first plural channel signals, a second OTT decoding of the second channel signal into a second plural channel signals, a third OTT decoding of the third channel signal into a third plural channel signals, a fourth OTT decoding of one of third plural channel signals output in the third decoding into a fourth plural channel signals, and a fifth OTT decoding of one of fourth plural channel signals output in the fourth OTT decoding into a fifth plural channel signals.

To achieve at least the above and/or further aspects and advantages, embodiments of the present invention include a multi-channel audio signal decoding system, including a first OTT decoder to decode a bitstream including two encoded audio channel signals, as first and second audio channel signals, and space information so that the first audio channel signal is decoded into a first plural audio channel signals, wherein the space information includes information of magnitude differences and/or similarities between corresponding channels, a second OTT decoder to decode the second audio channel signal into a second plural audio channel signals, as first and second channel signals, a third OTT decoder to decode one of the first plural channel signals output by the first OTT decoder into a third plural channel signals, a fourth OTT decoder to decode the first channel signal into a fourth plural channel signals, a fifth OTT decoder to decode the second channel signal into a fifth plural channel signals, and a sixth OTT decoder to decode another of the first plural channel signals of the first OTT decoder into a sixth plural channel signals.

To achieve at least the above and/or further aspects and advantages, embodiments of the present invention include a multi-channel audio signal decoding method including a first OTT decoding of a bitstream including two encoded audio channel signals, as a first audio channel signal and a second audio channel signal, and space information so that the first audio channel signal is decoded into a first plural audio channel signals, wherein the space information includes information of magnitude differences and/or similarities between corresponding channels, a second OTT decoding of the second audio channel signal into a second plural audio channel signals, as first and second channel signals, a third OTT decoding of one of the first plural channel signals obtained in the first OTT decoding into a third plural channel signals, a fourth OTT decoding of the first channel signal into a fourth plural audio channel signals, a fifth OTT decoding of the second channel signal into a fifth plural audio channel signals, and a sixth OTT decoding another of the first plural audio channel signals obtained in the first OTT decoding into a sixth plural channel signals.

To achieve at least the above and/or further aspects and advantages, embodiments of the present invention include a multi-channel audio signal encoding system, including a first OTT encoder to generate a first OTT audio channel (L') signal and a first OTT parameter from a left front audio channel (LF) signal and a left surround audio channel (LS) signal, wherein the first OTT parameter includes information of magnitude differences and/or similarities between corresponding LF and LS channels, a second OTT encoder to generate a second OTT audio channel (R') signal and a second OTT parameter from a right front audio channel (RF) signal and a right surround audio channel (RS) signal, wherein the second OTT parameter includes information of magnitude differences and/or similarities between corresponding RF and RS channels, third OTT encoder to generate a third OTT audio channel (C') signal and a third OTT parameter from a center audio channel (C) signal and a woofer audio channel (LFE) signal, wherein the third OTT parameter includes information of magnitude differences and/or similarities between corresponding C and LFE channels, a TTT encoder to generate plural TTT audio channel signals and a TTT parameter from the L', R', and C' channel signals output by the first, second, and third OTT encoders, respectively, wherein the TTT parameter includes information of magnitude differences and/or similarities between corresponding L', R', and C' channels, a fourth OTT encoder to generate a fourth OTT audio channel signal and a fourth OTT parameter from the plural TTT audio channel signals output by the TTT encoder, wherein the fourth OTT parameter includes information of magnitude differences and/or similarities between corresponding plural TTT channels, a bitstream generation unit to compress the OTT parameters generated by the first through fourth OTT encoders, the TTT parameter generated by the TTT encoder, and the fourth OTT audio signal generated by the fourth OTT encoder so as to generate a bitstream.

To achieve at least the above and/or further aspects and advantages, embodiments of the present invention include a multi-channel audio signal encoding system, including a first OTT encoder to generate a first OTT audio channel (FL') signal and a first OTT parameter from a front left audio channel (FL) signal and a front left center audio channel (FLC) signal, wherein the first OTT parameter includes information of magnitude differences and/or similarities between corresponding FL and FLC channels, a second OTT encoder to generate a second OTT audio channel (FR') signal and a second OTT parameter from a front right audio channel (FR) signal and a front right center audio channel (FRC) signal, wherein the second OTT parameter includes information of magnitude differences and/or a similarities between corresponding FR and FRC channels, a third OTT encoder to generate a third OTT audio channel (L') signal and a third OTT parameter from the audio channel (FL') signal produced by the first OTT encoder and a back left audio channel (BL) signal, wherein the third OTT parameter includes information of magnitude differences and/or similarities between corresponding FL' and BL channels, a fourth OTT encoder to generate a fourth OTT audio channel (R') signal and a fourth OTT parameter from the audio channel (FR') signal produced by the second OTT encoder and a back right audio channel (BR) signal, wherein the fourth OTT parameter includes information of magnitude differences and/or similarities between corresponding FR' and BR channels, a fifth OTT encoder to generate a fifth OTT audio channel (C') signal and a fifth OTT parameter from a center audio channel (C) signal and a woofer audio channel (LFE) signal, wherein the fifth OTT parameter includes information of magnitude differences and/or similarities between corresponding C and LFE channels, a TTT encoder producing plural TTT audio channel signals and a TTT parameter from the L', R', and C'channel signals output by the third, fourth, and fifth OTT encoders, respectively, wherein the TTT parameter includes information of magnitude differences and/or similarities between corresponding L', R', and C'channels, and a bitstream generation unit to compress the parameters generated by the first through fifth OTT encoders and the TTT encoder and the plural TTT audio signals generated by the TTT encoder so as to generate a bitstream.

To achieve at least the above and/or further aspects and advantages, embodiments of the present invention include a multi-channel audio signal encoding system, including a first OTT encoder to generate a first OTT audio channel (FC') signal and a first OTT parameter from a front left center audio channel (FLC) signal and a front right center audio channel (FRC) signal, wherein the first OTT parameter includes information of magnitude differences and/or similarities between corresponding FLC and FRC channels, a second OTT encoder to generate a second OTT audio channel (C'') signal and a second OTT parameter from the audio channel (FC') signal output by the first OTT encoder and a center audio channel (C) signal, wherein the second OTT parameter includes information of magnitude differences and/or similarities between corresponding FC' and C channels, a third OTT encoder to generate a third OTT audio channel (L') signal and a third OTT parameter from a front left audio channel (FL) signal and a back left audio channel (BL) signal, wherein the third OTT parameter includes information of magnitude differences and/or similarities between corresponding FL and BL channels, a fourth OTT encoder to generate a fourth OTT audio channel (R') signal and a fourth OTT parameter from an audio channel (FR) signal and a back right audio channel (BR) signal, wherein the fourth OTT parameter includes information of magnitude differences and/or similarities between corresponding FR and BR channels, a fifth OTT encoder to generate a fifth OTT audio channel (C') signal and a fifth OTT parameter from the audio channel (C'') signal output by the second OTT encoder and a woofer audio channel (LFE) signal, wherein the fifth OTT parameter includes information of magnitude differences and/or similarities between corresponding C'' and LFE channels, a TTT encoder to generate plural TTT audio channel signals and a TTT parameter from the L', R', and C' channel signals output by the third, fourth, and fifth OTT encoders, respectively, wherein the TTT parameter includes information of magnitude differences and/or similarities between the L', R', and C' channels, and a bitstream generation unit to compress the parameters generated by the first through fifth OTT encoders and the TTT encoder and the plural TTT audio channel signals generated by the TTT encoder so as to generate a bitstream.

To achieve at least the above and/or still further aspects and advantages, embodiments of the present invention include a multi-channel audio signal encoding system, including a first OTT encoder to generate a first OTT audio channel (C') signal and a first OTT parameter from a front left center audio channel (FLC) signal and a front right center audio channel (FRC) signal, wherein the first OTT parameter includes information of magnitude differences and/or similarities between corresponding FLC and FRC channels, a second OTT encoder to generate a second OTT audio channel (L') signal and a second OTT parameter from a front left audio channel (FL) signal and a back left audio channel (BL) signal, wherein the second OTT parameter includes information of magnitude differences and/or similarities between corresponding FL and BL channels, a third OTT encoder to generate a third OTT audio channel (R') signal and a third OTT parameter from a front right audio channel (FR) signal and a back right audio channel (BR) signal, wherein the third OTT parameter includes information of magnitude differences and/or similarities between corresponding FR and BR channels, a fourth OTT encoder to generate a fourth OTT audio channel (C') signal and a fourth OTT parameter from a center audio channel (C) signal and a woofer audio channel (LFE) signal, wherein the fourth OTT parameter includes information of magnitude differences and/or similarities between corresponding C and LFE channels, a fifth OTT encoder to generate a fifth OTT audio channel signal and a fifth OTT parameter from the audio channel (L') signal output by the second OTT encoder and the audio channel (C') signal output by the first OTT encoder, wherein the fifth OTT parameter includes information of magnitude differences and/or similarities between corresponding L' and C' channels, a sixth OTT encoder to generate a sixth OTT audio channel signal and a sixth OTT parameter from the audio channel (R') signal output by the third OTT encoder and the audio channel (C") signal output by the fourth OTT encoder, wherein the sixth OTT parameter includes information of magnitude differences and/or similarities between corresponding R' and C" channels, and a bitstream generation unit to compress the parameters generated by the first through sixth OTT encoders, the fifth OTT audio channel signal generated by the fifth OTT encoder, and the sixth OTT audio channel signal generated by the sixth OTT encoder so as to generate a bitstream.

To achieve at least the above and/or further aspects and advantages, embodiments of the present invention include a multi-channel audio signal encoding method, including a first OTT encoding of a first OTT parameter and a first OTT audio channel (L') signal from a left front audio channel (LF) signal and a left surround audio channel (LS) signal, wherein the first OTT parameter includes information of magnitude differences and/or similarities between corresponding LF and LS channels, a second OTT encoding of a second OTT parameter and a second OTT audio channel (R') signal from a right front audio channel (RF) signal and a right surround audio channel (RS) signal, wherein the second OTT parameter includes information of magnitude differences and/or similarities between corresponding RF and RS channels, a third OTT encoding of a third OTT parameter and a third OTT audio channel (C') signal from a center audio channel (C) signal and a woofer audio channel (LFE) signal, wherein the third OTT parameter includes information of magnitude differences and/or similarities between corresponding C and LFE channels, a TTT encoding of a TTT parameter and plural TTT audio channel signals from the L', R', and C channel signals produced in the first, second, and third OTT encodings respectively, wherein the TTT parameter includes information of magnitude differences and/or similarities between corresponding L', R', and C channels, a fourth OTT encoding of a fourth OTT parameter and a fourth OTT audio channel signal from the plural TTT audio channel signals generated in the TTT encoding, compressing the parameters generated in the first through fourth OTT encodings and the TTT encoding and the fourth OTT audio channel signal encoded in the fourth OTT encoding so as to generate a bitstream.

To achieve at least the above and/or further aspects and advantages, embodiments of the present invention include a multi-channel audio signal encoding method, including a first OTT encoding of a first OTT audio channel (FL') signal and a first OTT parameter from a front left audio channel (FL) signal and a front left center audio channel (FLC) signal, wherein the first OTT parameter includes information of magnitude differences and/or similarities between corresponding FL and FLC channels, a second OTT encoding of a second OTT audio channel (FR') signal and a second OTT parameter from a front right audio channel (FR) signal and a front right center audio channel (FRC) signal, wherein the second OTT parameter includes information of magnitude differences and/or similarities between corresponding FR and FRC channels, a third OTT encoding of a third OTT audio channel (L') signal and a third OTT parameter from the front left audio channel (FL') signal generated in the first OTT encoding and a back left audio channel (BL) signal, wherein the third OTT parameter includes information of magnitude differences and/or similarities between corresponding FL' and BL channels, a fourth OTT encoding of a fourth OTT audio channel (R') signal and a fourth OTT parameter from the front right audio channel (FR') signal generated in the second OTT encoding and a back right audio channel (BR) signal, wherein the fourth OTT parameter includes information of magnitude differences and/or similarities between corresponding FR' and BR channels, a fifth OTT encoding of a fifth OTT audio channel (C') signal and a fifth OTT parameter from a center audio channel (C) signal and a woofer audio channel (LFE) signal, wherein the fifth OTT parameter includes information of magnitude differences and/or similarities between corresponding C and LFE channels, a TTT encoding of plural TTT (stereo) audio channel signals and a TTT parameter from the L', R', and C' channel signals generated in the third, fourth, and fifth OTT encodings, respectively, wherein the TTT parameter includes information of magnitude differences and/or similarities between corresponding L', R', and C' channels, compressing the parameters generated in the first through fifth OTT encodings and the plural stereo audio channel signals generated in the TTT encoding so as to generate a bitstream.

To achieve at least the above and/or further aspects and advantages, embodiments of the present invention include a multi-channel audio signal encoding method, including a first OTT encoding of a first OTT audio channel (FC') signal and a first OTT parameter from a front left center audio channel (FLC) signal and a front right center audio channel (FRC) signal, wherein the first OTT parameter includes information of magnitude differences and/or similarities between corresponding FLC and FRC channels, a second OTT encoding of a second OTT audio channel (C") signal and a second OTT parameter from the audio channel (FC') signal generated in the first OTT encoding and a center audio channel (C) signal, wherein the second OTT parameter includes information of magnitude differences and/or similarities between corresponding FC' and C channels, a third OTT encoding of a third OTT audio channel (L') signal and a third OTT parameter from a front left audio channel (FL) signal and a back left audio channel (BL) signal, wherein the third OTT parameter includes information of magnitude differences and/or similarities between corresponding FL and BL channels, a fourth OTT encoding of a fourth OTT audio channel (R') signal and a fourth OTT parameter from a front right audio channel (FR) signal and a back right audio channel (BR) signal, wherein the fourth OTT parameter includes information of magnitude differences and/or similarities between corresponding FR and BR channels, a fifth OTT encoding of a fifth OTT audio channel (C') signal and a fifth OTT parameter from the audio channel (C") signal generated in the second OTT encoding and a woofer audio channel (LFE) signal, wherein the fifth OTT parameter includes information of magnitude differences and/or similarities between corresponding C and LFE channels, a TTT encoding of plural TTT (stereo) audio channel signals and a TTT parameter from the L', R', and C' channel signals generated in the third, fourth, and fifth OTT encodings, respectively, wherein the TTT parameter includes information of magnitude differences and/or similarities between corresponding L', R', and C' channels, compressing the parameters generated in the first through fifth OTT encodings and the audio channel signals generated in the TTT encoding so as to generate a bitstream.

To achieve at least the above and/or further aspects and advantages, embodiments of the present invention include a multi-channel audio signal encoding method, including a first OTT encoding of a first OTT audio channel (C') signal and a first OTT parameter from a front left center audio channel (FLC) signal and a front right center audio channel (FRC) signal, wherein the first OTT parameter includes information of magnitude differences and/or similarities between corresponding FLC and FRC channels, a second OTT encoding of a second OTT audio channel (L') signal and a second OTT parameter from a front left audio channel (FL) signal and a back left audio channel (BL) signal, wherein the second OTT parameter includes information of magnitude differences and/or similarities between corresponding FL and BL channels, a third OTT encoding of a third OTT audio channel (R') signal and a third OTT parameter from a front right audio channel (FR) signal and a back right audio channel (BR) signal, wherein the third OTT parameter includes information of magnitude differences and/or similarities between corresponding FR and BR channels, a fourth OTT encoding of a fourth OTT audio channel (C") signal and a fourth OTT parameter from a center audio channel (C) signal and a woofer audio channel (LFE) signal, wherein the fourth OTT parameter includes information of magnitude differences and/or similarities between corresponding C and LFE channels, a fifth OTT encoding of a fifth OTT audio channel signal and a fifth OTT parameter from the audio channel (L') signal generated in the second OTT encoding and the audio channel (C') signal generated in the first OTT encoding, wherein the fifth OTT parameter includes information of magnitude differences and/or similarities between corresponding L' and C' channels, a sixth OTT encoding of a sixth OTT audio channel signal and a sixth OTT parameter from the audio channel (R') signal generated in the first OTT encoding and the audio channel (C) signal generated in the fourth OTT encoding, wherein the sixth OTT parameter includes information of magnitude differences and/or similarities between corresponding R' and C" channels, and compressing the parameters generated in the first through sixth OTT encodings, the fifth OTT audio channel signal generated in the fifth OTT encoding, and the sixth OTT audio channel signal generated in the sixth OTT encoding so as to generate a bitstream.

To achieve at least the above and/or still further aspects and advantages, embodiments of the present invention include at least one medium including computer readable code to control at least one processing element to implement an embodiment of the present invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF EMBODIMENTS

Figure 1:
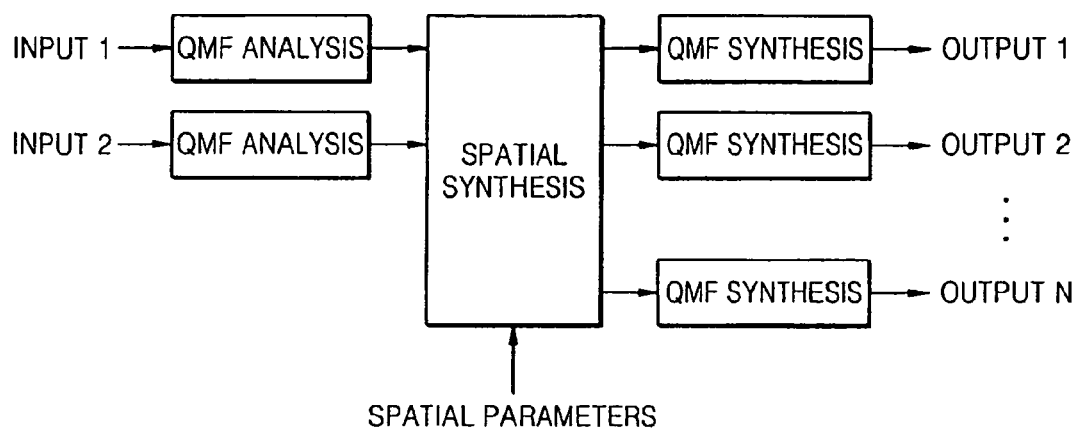
FIG. 1 illustrates a conventional MPEG surround decoder.
Figure 2:
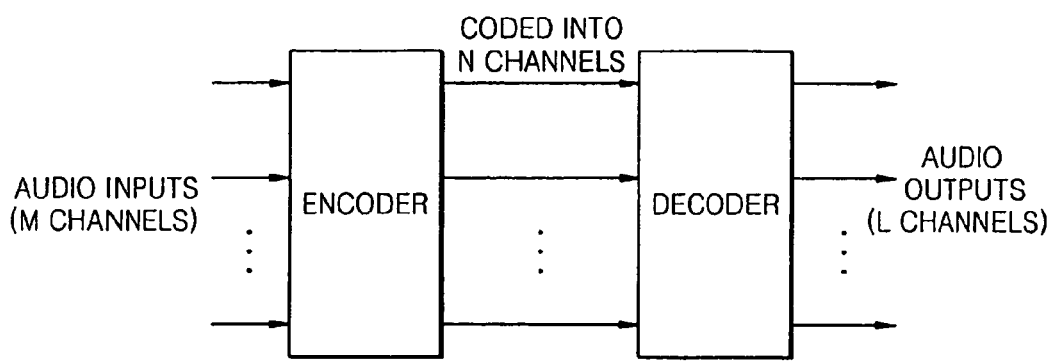
FIG. 2 illustrates a conventional encoder for encoding an input audio channel signal, a resultant encoded audio channel signal bitstream, and a conventional decoder for decoding the encoded audio channel signal.

Reference will now be made in detail to embodiments of the present invention, examples of which are illustrated in the accompanying drawings, wherein like reference numerals refer to the like elements throughout. Embodiments are described below to explain the present invention by referring to the figures.

Hereinafter, according to differing embodiments of the present invention, even a single input bitstream can be selectively decoded into audio channel signals of a suitable number of channels based on the type of receiver speaker configuration. Accordingly, scalable channel decoding can be achieved by only partially decoding the input bitstream. In the scalable channel decoding, a decoder may set decoding levels, setting the level of decoding, and output audio channel signals according to the decoding levels, thereby decreasing the decoding complexity.

Figure 3:
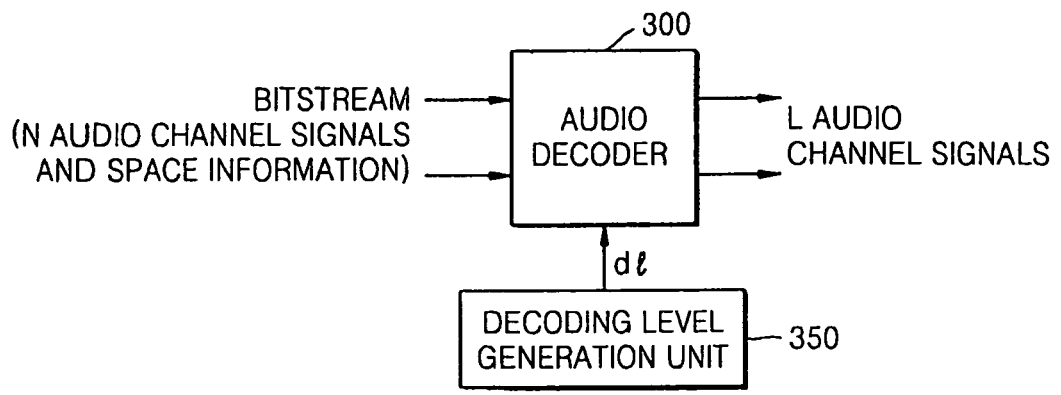
FIG. 3 illustrates a multi-channel audio signal decoding system, according to an embodiment of the present invention.

FIG. 3 illustrates a multi-channel audio signal decoding system, according to an embodiment of the present invention, which may include an audio decoder 300 and a decoding level generation unit 350, for example. The decoding level generation unit 350 may produce decoding level information that helps in the decoding of a bitstream having a predetermined number N of audio channel signals and space information into a predetermined number L (where L≥N) of audio channel signals. Here, the space information may include information about magnitude differences and similarities between channels, during the corresponding encoding of the channels.

Thus, the audio decoder 300 may selectively decode the bitstream according to such decoding level information and output the L audio channel signals.

Figure 4:
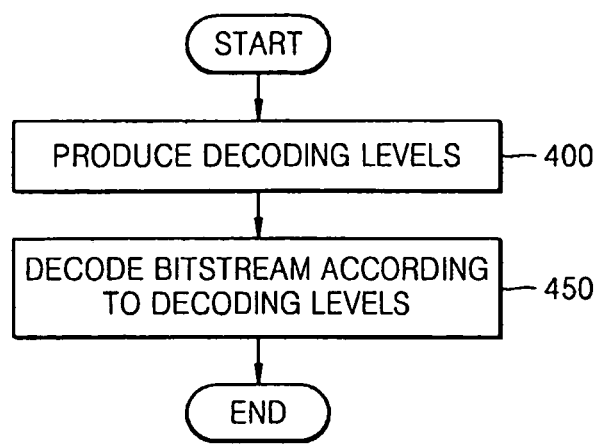
FIG. 4 illustrates a multi-channel audio signal decoding method, according to an embodiment of the present invention.
Figure 5:
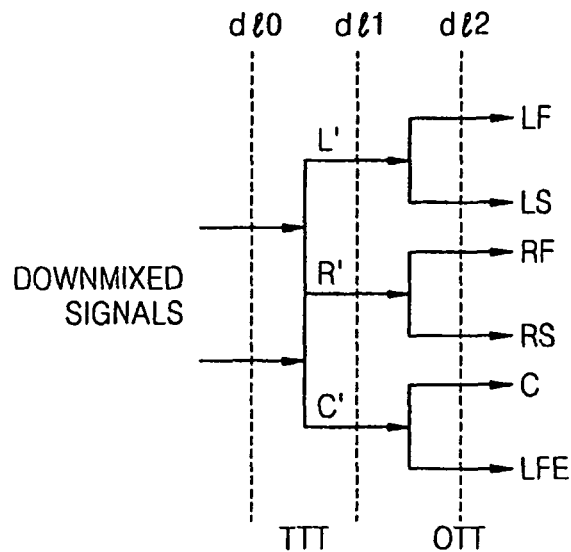
FIG. 5 illustrates a decoder for decoding a downmixed signal, such as described in FIG. 4 by referring to various decoding levels, according to an embodiment of the present invention.

FIG. 4 illustrates a multi-channel audio signal decoding method, according to an embodiment of the present invention. In operation 400, the decoding level information that may be used in the selective decoding of the bitstream, e.g., including the N audio channel signals and the space information, into the L audio channel signals may be produced. The bitstream may be a downmixed signal, e.g., a mono signal, included with the space information for eventual upmixing to additional signals through modification of the downmixed signal based upon the space information. Here, as noted above, the bitstream may include the downmixed signal and additional material, which may be variously called special parameters or spatial cues, for example, with that additional material including information on how each upmixed signal differentiates from either each other or from the downmixed mono signal. With this technique of sending only the downmixed signal and the additional material, substantial data volume can be reduced, e.g., with almost half as much total data being sent for the downmixed mono signal compared to data required for each separate left and right example channels. Thus, further to above, FIG. 5 further illustrates a decoder decoding the downmixed signal by referring to various decoding levels. Reference characters dl0, dl1, and dl2 denote such decoding levels, wherein dl0 denotes a core decoding level. FIG. 5 illustrates a two-to-three decoding tool (TTT) at the dl1 level, and one-to-two decoding tools (OTT) at the dl2 level. As an example, if the dl2 level is used for decoding the downmixed signals, only the left (L'), right (R'), and center (C') are decoded and output for a left, right, and center channel speakers. Such operation is further discussed with the below reference to FIG. 6.

Again, in FIG. 4, in operation 450, the bitstream may be decoded based on the decoding levels to output the desired number of decoded audio channel signals corresponding to the appropriate decoding level.

Figure 6:
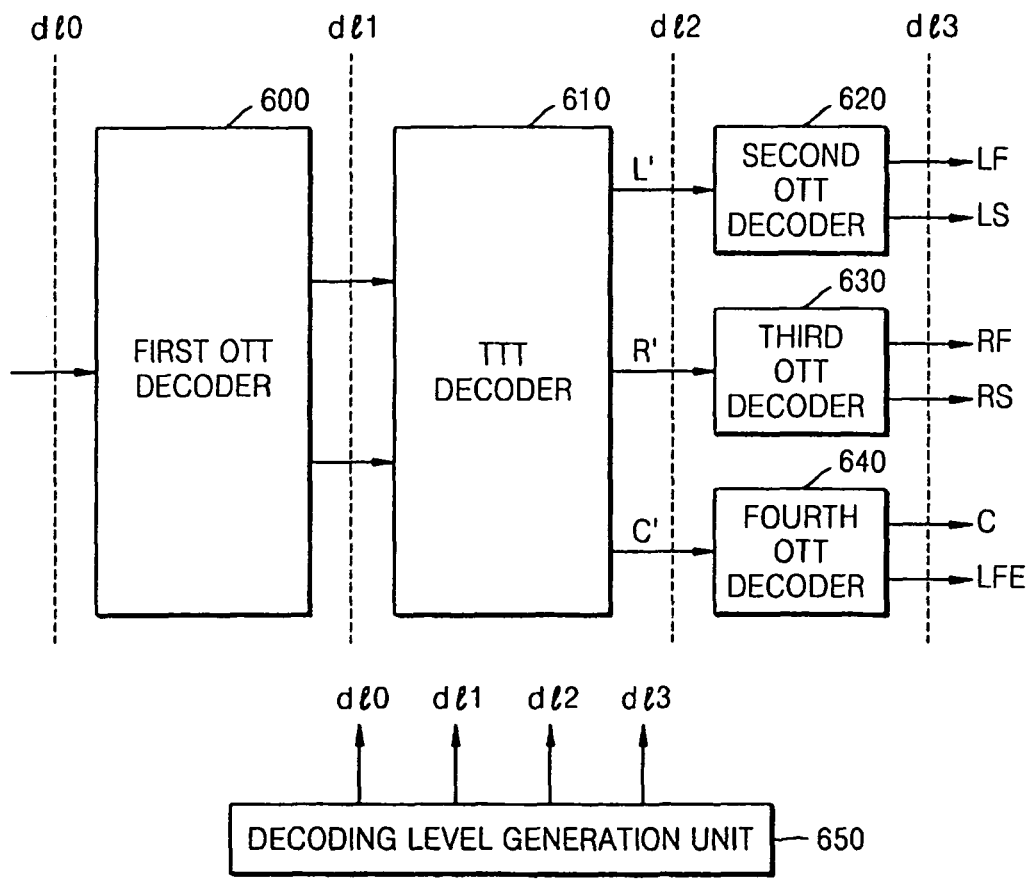
FIG. 6 illustrates a multi-channel audio signal decoding system, according to an embodiment of the present invention.

FIG. 6 illustrates a multi-channel audio signal decoding system, according to an embodiment of the present invention, which may include a first OTT decoder 600, a TTT decoder 610, a second OTT decoder 620, a third OTT decoder 630, and a fourth OTT decoder 640, for example. The multi-channel audio signal decoding system may further include a decoding level generation unit 650, for example.

The first OTT decoder 600 decodes a bitstream including one audio channel signal, e.g., a downmixed signal, and the aforementioned space information so that the single audio channel signal is upmixed and output as two audio channel signals. Here, the space information may include magnitude differences between the channels, during the corresponding encoding of the channels, and information about similarities between the same channels. The two audio channels output by the first OTT decoder 600 may be considered stereo audio channels, e.g., for selective output to left and right speakers if the dl1 level is used in the decoding.

The TTT decoder 610 decodes the two audio channel signals into three audio channel signals. Here, the three channels of the three audio channel signals output by the TTT decoder 610 may be considered a left audio channel L', a right audio channel R', and a center audio channel C', for example.

When the three audio channels signals output by the TTT decoder 610 are referred to as first, second, and third channel signal, the second OTT decoder 620 may decode the first channel signal into two channel signals. The two channels of the two channel signals may be considered a left front audio channel LF and a left surround audio channel LS, for example.

Similarly, the third OTT decoder 630 may decode the second channel signal into two channel signals. The two channels of the two channel signals may be considered a right front audio channel RF and a right surround audio channel RS, for example.

Again, the fourth OTT decoder 640 may decode the third channel signal into two channel signals. The two channels of the two channel signals may be a center audio channel C and a woofer audio channel LFE, for example.

In one embodiment, the decoding level generation unit 650 may produce decoding level information used in the selective decoding of the bitstream into a predetermined number of audio channel signals. The decoding level information may include a first decoding level dl0, a second decoding level dl1, a third decoding level dl2, and a fourth decoding level dl3, for example. The first decoding level dl0 may be used in the decoding of a bitstream, including one audio channel signal, to control the selection level of decoding the bitstream into one audio channel signal for output. The second decoding level dl1 may be used in the decoding of the bitstream, including the single audio channel signal output at the first decoding level dl0, to control the selection level of decoding the bitstream into two audio channel signals. The third decoding level dl2 may be used in the decoding of the bitstream, including the two audio channel signals output at the second decoding level dl1, to control the selection level of decoding the bitstream into three audio channel signals, e.g., L', R', and C' channels. The fourth decoding level dl3 may be used in the decoding of the bitstream, including the three audio channel signals, output at the third decoding level dl2 to control the selection level of decoding the bitstream into signals of 5.1 audio channels LF, LS, RF, RS, C, and LFE, for example.

Figure 7:
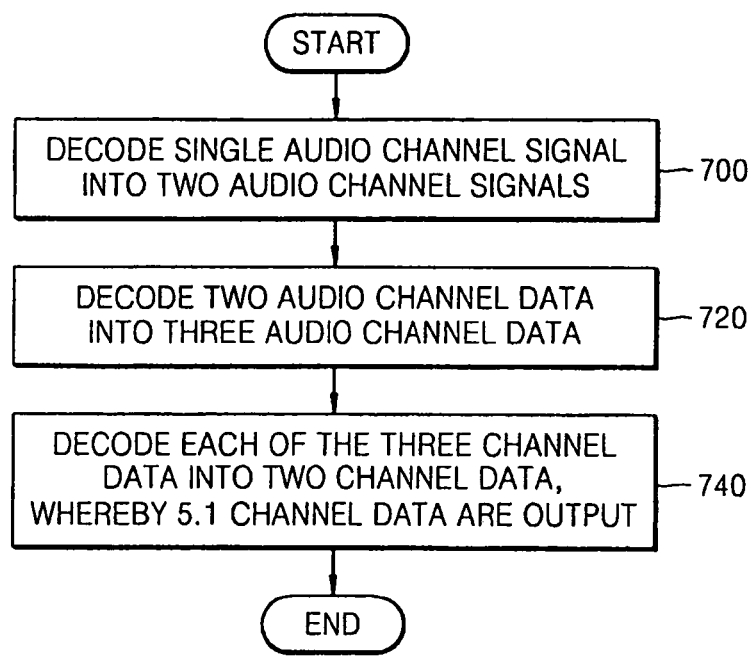
FIG. 7 illustrates a multi-channel audio signal decoding method, according to another embodiment of the present invention.

FIG. 7 illustrates a multi-channel audio signal decoding method, according to an embodiment of the present invention. In operation 700, a bitstream including a single audio channel signal and space information, e.g., including magnitude differences between channels and/or information about similarities between channels, is decoded so that the two audio channel signals are output. The two channels may be considered stereo audio channels, for example.

In operation 720, the two audio channel signals, e.g., from operation 700, may be decoded into three audio channel signals, with the three channels of the three audio channels, e.g., output by the TTT decoder 610, being considered the left audio channel L', the right audio channel R', and the center audio channel C'.

When the three audio channel signals, e.g., obtained in operation 720, are referred to as first, second, and third channel signal, each of the first, second, and third channel signals is decoded into two channel signals, whereby 5.1 channel signals are output, in operation 740. Here, the two channels of the two channel signals into which the first channel is decoded may be considered left front audio channel LF and a left surround audio channel LS, the two channels of the two channel signals into which the second channel signal is decoded may be considered a right front audio channel RF and a right surround audio channel RS, and the two channels of the two channel signals into which the third channel signal is decoded may be considered a center audio channel C and a woofer audio channel LFE.

Thus, to achieve the decoding of the bitstream into a predetermined number of audio channel signals, decoding level information may be needed. The decoding level information may include a first decoding level that may be used in the selective decoding of the bitstream including one audio channel signal to be decoded into one audio channel signal, a second decoding level information that may be used in the selective decoding of the bitstream including the single audio channel signal output at the first decoding level to be decoded into two audio channel signals, a third decoding level that may be used in the selective decoding of the bitstream including the two audio channel signals output at the second decoding level to be decoded into three audio channel signals of the three channels L', R', and C', and a fourth decoding level that may be used in the selective decoding of the bitstream including the three audio channel signals output at the third decoding level to be decoded into signals of 5.1 audio channels LF, LS, RF, RS, C, and LFE, for example.

Figure 8:
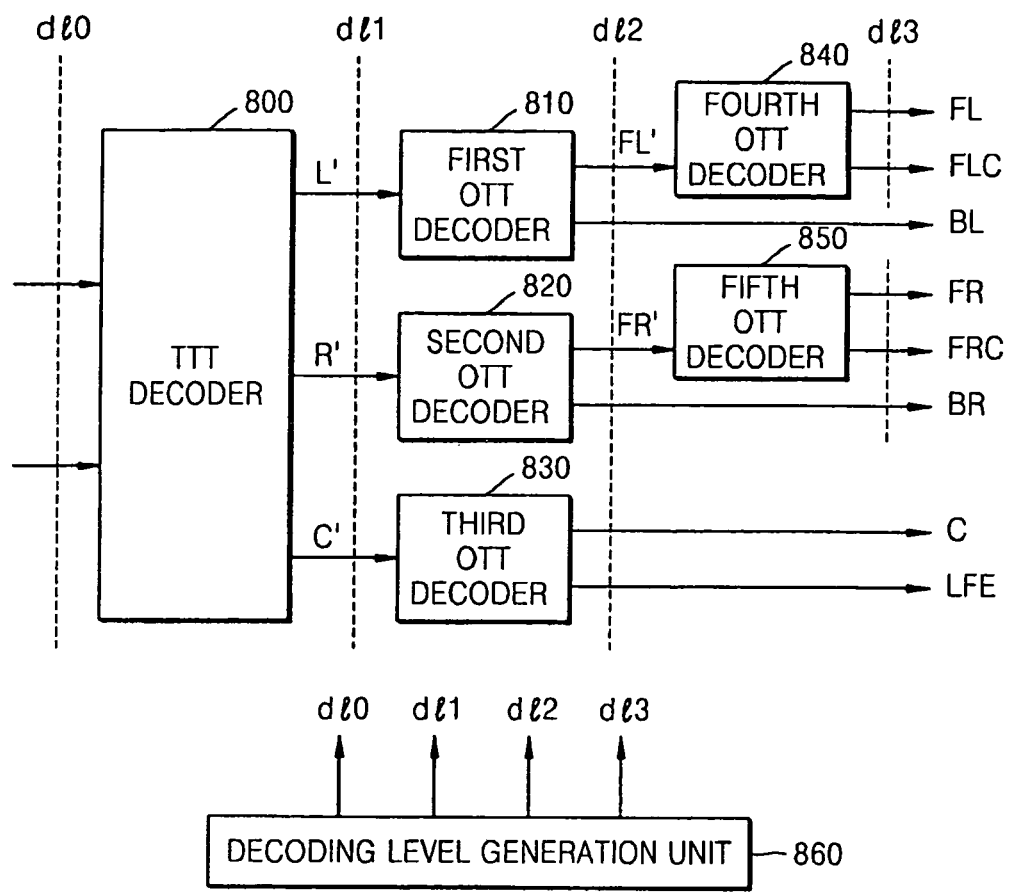
FIG. 8 illustrates a multi-channel audio signal decoding system, according to an embodiment of the present invention.

FIG. 8 illustrates a multi-channel audio signal decoding, system according to an embodiment of the present invention, which may include a TTT decoder 800, a first OTT decoder 810, a second OTT decoder 820, a third OTT decoder 830, a fourth OTT decoder 840, and a fifth OTT decoder 850, for example. The multi-channel audio signal decoding system may further include a decoding level generation unit 860, also as an example.

The TTT decoder 800 may decode a bitstream including two audio channel signals and space information so that the two audio channel signals are output as three audio channel signals, for example. Here, the space information may include information about magnitude differences and similarities between channels, during the corresponding encoding of the channels. The channels of the three audio channel signals output by the TTT decoder 800 may be considered a left audio channel L', a right audio channel R', and a center audio channel C', for example.

With the three audio channel signals output by the TTT decoder 800 being referred to as first, second, and third channel signal, the first OTT decoder 810 decodes the first channel signal into two channel signals, with the two channels of the two channel signals being considered a front left audio channel FL' and a back left audio channel BL.

The second OTT decoder 820 may decode the second channel signal into two additional channel signals, with these two channels of the two channel signals being considered a front right audio channel FR' and a back right audio channel BR.

The third OTT decoder 830 may decode the third channel signal into two further channel signals, with these two channels of the two channel signals being considered a center audio channel C and a woofer audio channel LFE.

The fourth OTT decoder 840 may further decode one of the output signals of the first OTT decoder 810, that is, the signal of the front left audio channel FL', into two further channel signals, with these two channels of the two channel signals output by the fourth OTT decoder 840 being considered a front left audio channel FL and a front left center audio channel FLC.

The fifth OTT decoder 850 may still further decode one of the output signal of the second OTT decoder 820, that is, the signal of the front right audio channel FR', into two further channel signals, with these two channels of the two channel signals output by the fifth OTT decoder 850 being considered a front right audio channel FR and a front right center audio channel FRC.

The decoding level generation unit 860 may generate decoding level information that may be used in the selective decoding of the bitstream into a predetermined number of audio channel signals. Here, the decoding level information may include a first decoding level dl0, a second decoding level dl1, a third decoding level dl2, and a fourth decoding level dl3, for example.

The first decoding level dl0 may be used in the selective decoding of the bitstream including two audio channel signals into two audio channel signals. The second decoding level dl1 may be used in the selective decoding of the bitstream including the two audio channel signals output at the first decoding level dl0 into signals of three audio channels L', R', and C', for example. The third decoding level dl2 may be used in the selective decoding of the bitstream including the three audio channel signals output at the second decoding level dl1 into signals of 5.1 audio channels FL', BL, FR', BR, C, and LFE, for example.

The fourth decoding level dl3 may be used in the selective decoding of the FL' channel signal into the signals of the two audio channels FL and FLC and the FR' channel signal into the signals of the two audio channels FR and FRC so that a total of 7.1 channel signals are output, for example.

Figure 9:
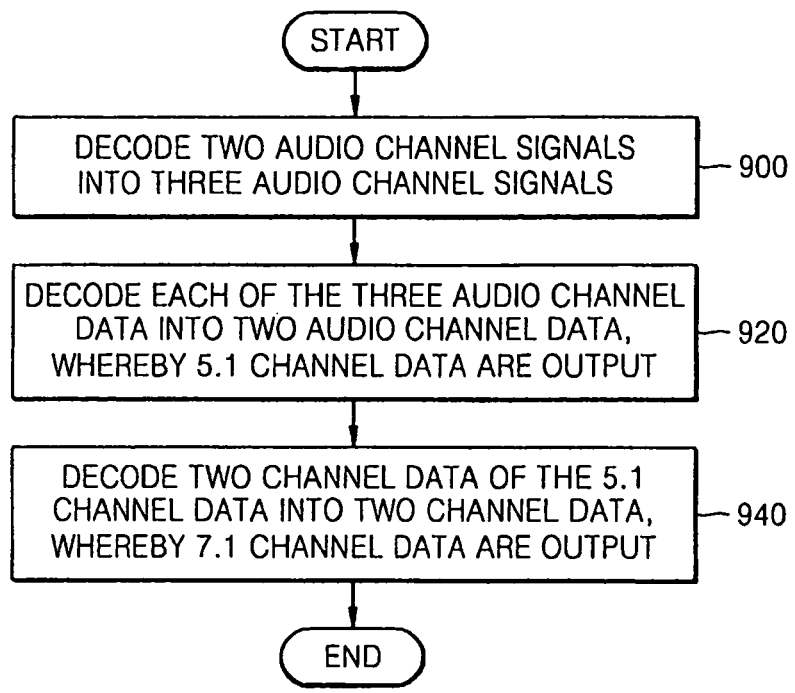
FIG. 9 illustrates a multi-channel audio signal decoding method, according to another embodiment of the present invention.

FIG. 9 illustrates a multi-channel audio signal decoding method, according to an embodiment of the present invention. In operation 900, a bitstream including two audio channel signals and space information, which may include information about magnitude differences and similarities between the channels, during the corresponding encoding of the channels, is decoded so that the three audio channel signals are output. The three channels of the three audio channel signals may be considered the left audio channel L', the right audio channel R', and the center audio channel C', for example.

With the three audio channel signals obtained in operation 900 being referred to as first, second, and third channel signals, each of the first, second, and third channel signals may be further decoded into two additional channel signals so that 5.1 channel signals are output, in operation 920. The two channels of the two channel signals into which the first channel signal is decoded may be considered the front left audio channel FL' and the back left audio channel BL, the two channels of the two channel signals into which the second channel signal is decoded may be considered a front right audio channel FR' and a back right audio channel BR, and the two channels of the two channel signals into which the third channel signal is decoded may be considered a center audio channel C and a woofer audio channel LFE, for example.

In operation 940, each of the signals of two channels for the 5.1 channels may be further decoded such that signals of 7.1 channels are output. The channels of a signal into which the two channel signals are decoded in operation 940 may be considered the front left audio channel FL, the front left center audio channel FLC, the front right audio channel FR, and the front right center audio channel FRC, for example.

To achieve the aforementioned decoding of a bitstream into a predetermined number of audio channel signals, decoding level information generated by a decoder may be used, for example, so that audio channel signals can be decoded and output based upon the appropriate decoding levels. The decoding level information may include the first decoding level dl0, which may be used in the selective decoding of the bitstream including two audio channel signals into two audio channel signals, the second decoding level dl1, which may be used in the selective decoding of the a bitstream including the two audio channel signals output at the first decoding level dl0 into signals of the three audio channels L', R', and C', the third decoding level dl2, which may be used in the selective decoding of the a bitstream including the three audio channel signals into signals of 5.1 audio channels LF, LS, RF, RS, C, and LFE, and the fourth decoding level dl3, which may be used in the selective decoding of the FL' channel signal into the signals of the two audio channels FL and FLC and the FR' channel signal into the signals of the two audio channels FR and FRC so that a total of 7.1 channel signals are output, in this embodiment.

Figure 10:
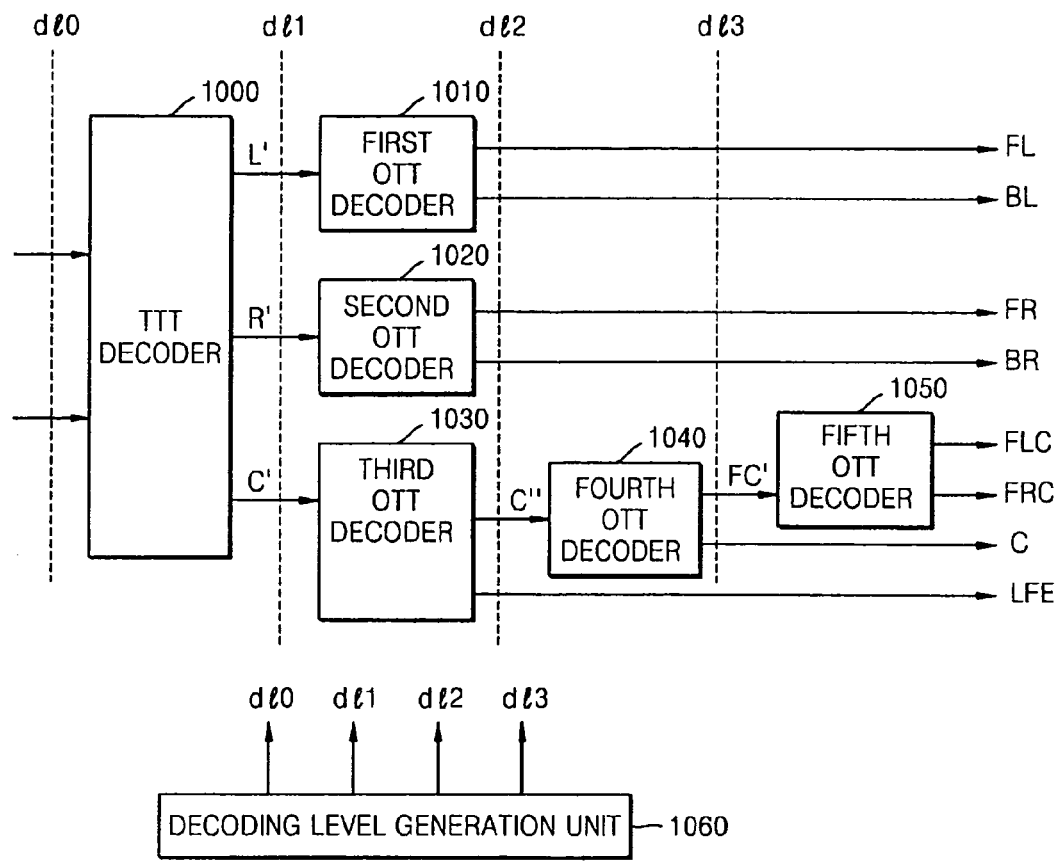
FIG. 10 illustrates a multi-channel audio signal decoding system, according to another embodiment of the present invention.

FIG. 10 illustrates a multi-channel audio signal decoding system, according to an embodiment of the present invention, and may include a TTT decoder 1000, a first OTT decoder 1010, a second OTT decoder 1020, a third OTT decoder 1030, a fourth OTT decoder 1040, and a fifth OTT decoder 1050, for example. The multi-channel audio signal decoding system may further include a decoding level generation unit 1060, for example.

The TTT decoder 1000 may decode a bitstream including two audio channel signals and space information so that the three audio channel signals are output from two audio channel signals. Here, the space information may include information about magnitude differences and similarities between the channels, during the corresponding encoding of the channels. The channels of the three audio channel signals output by the TTT decoder 1000 may be considered a left audio channel L', a right audio channel R', and a center audio channel C', for example.

With the three audio channel signals output by the TTT decoder 1000 being referred to as first, second, and third channel signals, the first OTT decoder 1010 may decode the first channel signal into two channel signals. The two channels of the two channel signals may be considered a front left audio channel FL and a back left audio channel BL, for example.

The second OTT decoder 1020 may decode the second channel signal into two channel signals, with these two channels of the two channel signals being considered a front right audio channel FR and a back right audio channel BR, for example.

Similarly, the third OTT decoder 1030 may decode the third channel signal into two channel signals, with these two channels of the two channel signals being considered a center audio channel C" and a woofer audio channel LFE, again as an example.

The fourth OTT decoder 1040 may further decode one of the output signals of the third OTT decoder 1030, e.g., the signal of the center audio channel C", into two channel signals, with these two channels of the two channel signals output by the fourth OTT decoder 1040 being considered a front center audio channel FC' and a center audio channel C, for example.

The fifth OTT decoder 1050 may still further decode one of the output signals of the fourth OTT decoder 1040, e.g., the FC' channel signal, into two channel signals, with the two channels of the two channel signals output by the fifth OTT decoder 1050 being considered a front left center audio channel FLC and a front right center audio channel FRC, for example.

In one embodiment, the decoding level generation unit 1060 may generate decoding level information that may be used during the selective decoding of the bitstream into a predetermined number of audio channel signals. The decoding level information may include a first decoding level dl0, a second decoding level dl1, a third decoding level dl2, and a fourth decoding level dl3, for example.

Here, the first decoding level dl0 may be used during the selective decoding of the bitstream including two audio channel signals to be decoded into two audio channel signals, the second decoding level dl1 may be used during the selective decoding of the bitstream including the two audio channel signals output at the first decoding level dl0 into signals of three audio channels L', R', and C', the third decoding level dl2 may be used during the selective decoding of the bitstream including the three audio channel signals output at the second decoding level dl1 into signals of 5.1 audio channels FL, BL, FR, BR, C", and LFE, and the fourth decoding level dl3 may be used during the selective decoding of the FC' channel signal into the two FLC and FRC channel signals so that a total of 7.1 channel signals are output.

Figure 11:
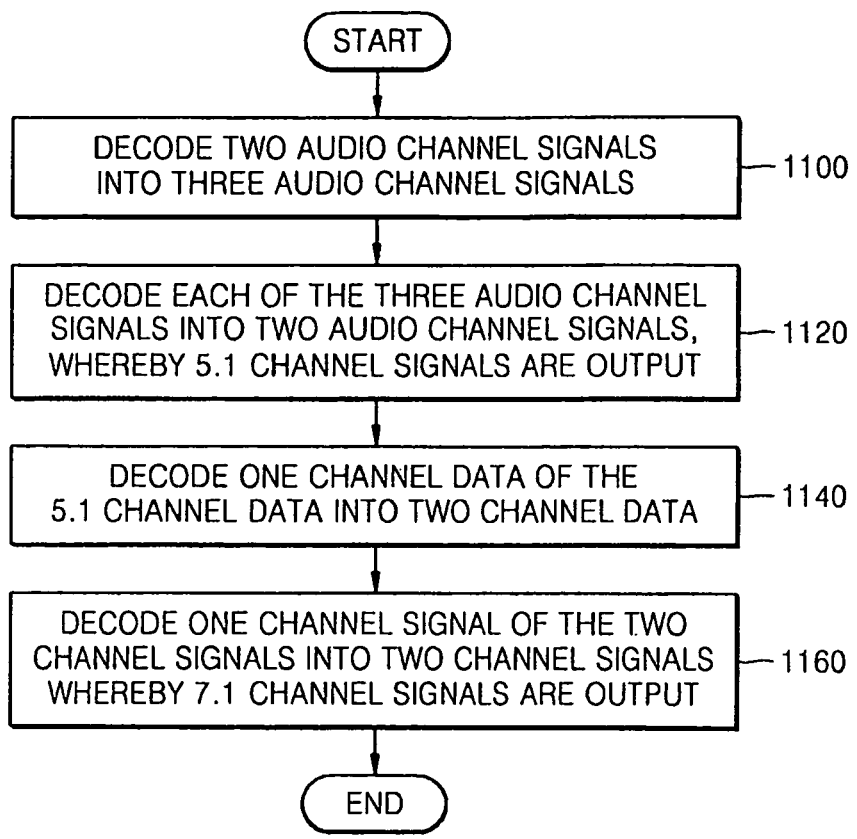
FIG. 11 illustrates a multi-channel audio signal decoding method, according to another embodiment of the present invention.

FIG. 11 illustrating a multi-channel audio signal decoding method, according to an embodiment of the present invention. In operation 1100, a bitstream including two audio channel signals and space information that includes magnitude differences between the channels and information about similarities between channels is decoded so that the three audio channel signals are output from two audio channel signals. The three channels of the three audio channel signals may be considered the left audio channel L', the right audio channel R', and the center audio channel C', for example.

With the three audio channel signals obtained in operation 1100 being referred to as first, second, and third channel signals, each of the first, second, and third channel signals may be decoded into two channel signals so that 5.1 channel signals are output, in operation 1120. More specifically, the two channels of the two channel signals into which the first channel signal is decoded may be considered the front left audio channel FL and the back left audio channel BL, the two channels of the two channel signals into which the second channel signal is decoded may be considered the front right audio channel FR and the back right audio channel BR, and the two channels of the two channel signals into which the third channel signal is decoded may be considered the center audio channel C" and the woofer audio channel LFE.

In operation 1140, the signals of two channels of the 5.1 channels output in operation 1120 may be further decoded into two channel signals, with the channels of the two channel signals being considered the front center audio channel FC' and the center audio channel C, for example.

In operation 1160, one of the two channel signals output in operation 1140, for example, may be decoded into two channel signals, whereby 7.1 channel signals are output, with the channels of the two channel signals being considered the front left center audio channel FLC and the front right center audio channel FRC, for example.

Thus, according to this embodiment, to achieve such a selective decoding of the bitstream into a predetermined number of audio channel signals, decoding level information generated by a decoder may be used so that audio channel signals are output based on the decoding levels. The decoding level information may include the first decoding level dl0, which may be used during the selective decoding of the bitstream including two audio channel signals into two audio channel signals, the second decoding level dl1, which may be used during the selective decoding of the bitstream including the two audio channel signals output at the first decoding level dl0 into signals of the three audio channels L', R', and C', the third decoding level dl2, which may be used during the selective decoding of the bitstream including the three audio channel signals to be decoded into signals of 5.1 audio channels FL, BL, FR, BR, C", and LFE, and the fourth decoding level dl3, which may be used during the selective decoding of the FC' channel signal to be decoded into the signals of the two audio channels FLC and FRC so that a total of 7.1 channel signals are output.

Figure 12:
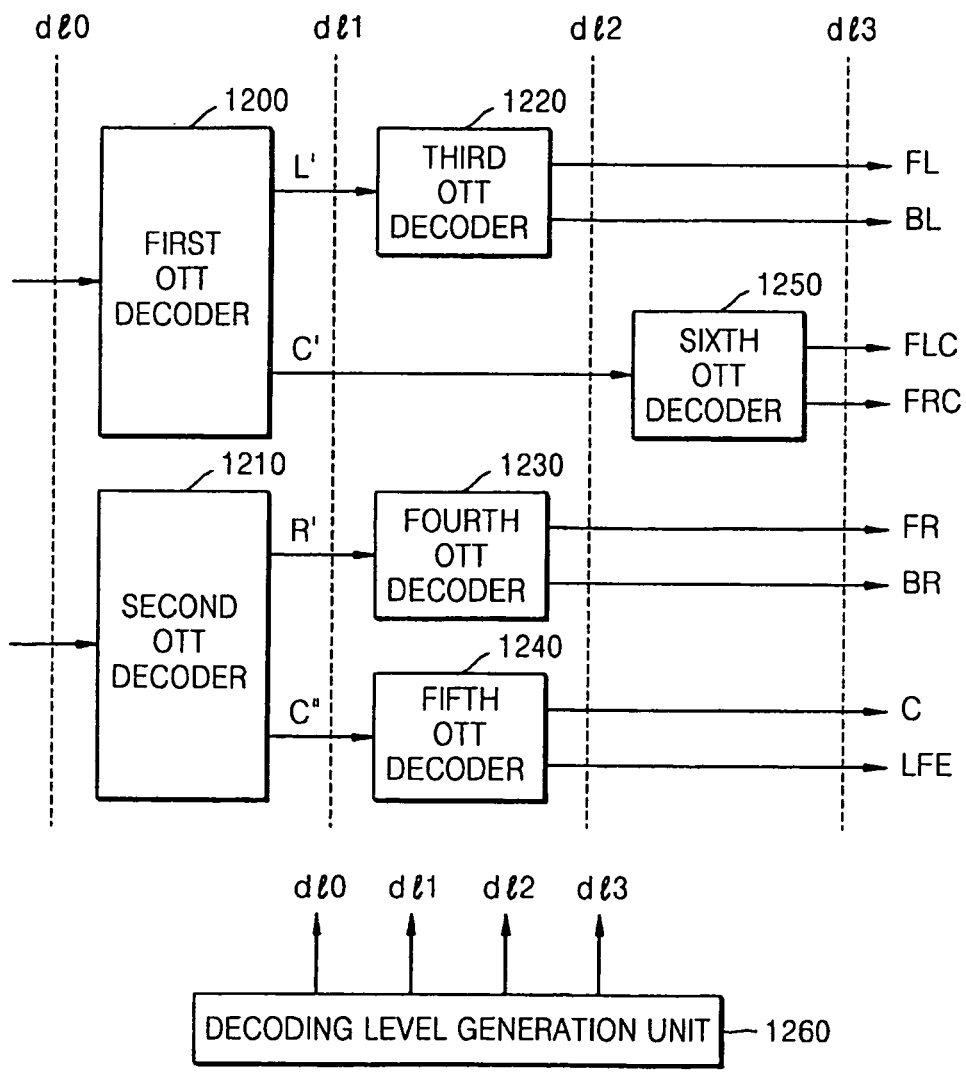
FIG. 12 illustrates a multi-channel audio signal decoding system, according to still another embodiment of the present invention.

FIG. 12 illustrates a multi-channel audio signal decoding system, according to an embodiment of the present invention, which may include a first OTT decoder 1200, a second OTT decoder 1210, a third OTT decoder 1220, a fourth OTT decoder 1230, a fifth OTT decoder 1240, and a sixth OTT decoder 1250, for example. The multi-channel audio signal decoding system may further include a decoding level generation unit 1260, in an embodiment.

In response to a bitstream including two audio channel signals, e.g., first and second audio channel signals, and space information, the first OTT decoder 1200 may decode the first audio channel signal into two audio channel signals. Here, the space information may include information about magnitude differences between channels, during the corresponding encoding of the channels, and similarities therebetween. The channels of the two audio channel signals output by the first OTT decoder 1200 may be considered a left audio channel L' and a center audio channel C', for example.

The second OTT decoder 1210 may decode the bitstream so that two audio channel signals are output as the second audio channel signal. The channels of the two audio channel signals output by the second OTT decoder 1210 may be considered a right audio channel R' and a center audio channel C".

The third OTT decoder 1220 may decode one of the two channel signals output by the first OTT decoder 1200, e.g., the L' channel signal, into two further channel signals. The two channels of the two channel signals output by the third OTT decoder 1220 may be considered a front left center audio channel FL and a back left audio channel BL, for example.

With the two audio channel signals output by the first OTT decoder 1210 being referred to as first and second channel signals, the fourth OTT decoder 1230 may decode the first channel signal into two channel signals, with the two channels of the two channel signals being considered a front right audio channel FR and a back right audio channel BR.

The fifth OTT decoder 1240 may decode the second channel signal into two channel signals, with the two channels of the two channel signals being considered a center audio channel C and a woofer audio channel LFE.

The sixth OTT decoder 1250 may decode the other of the two output signals of the first OTT decoder 1200, e.g., the C' channel signal, into two channel signals, with the two channels of the two channel signals output by the sixth OTT decoder 1250 being a front left center audio channel FLC and a front right center audio channel FRC.

In an embodiment, the decoding level generation unit 1260 may generate decoding level information that may be used in selective decoding of the bitstream into a predetermined number of audio channel signals. The decoding level information may include a first decoding level dl0, a second decoding level dl1, a third decoding level dl2, and a fourth decoding level dl3, for example.

Here, the first decoding level dl0 may be used during the selective decoding of the bitstream including two audio channel signals into two audio channel signals.

The second decoding level dl1 may be used during the selective decoding of the bitstream including the two audio channel signals output at the first decoding level dl0 into signals of four audio channels L', C', R', and C", for example.

The third decoding level dl2 may be used during the selective decoding of the L' audio channel signal into signals of two audio channels FL and BL, the R' audio channel signal to be decoded into signals of two audio channels FR and BR, and the C" audio channel signal to be decoded into signals of two audio channels C and LFE, for example.

The fourth decoding level dl3 may be used during the selective decoding of the C" channel signal into the two FLC and FRC channel signals.

Figure 13:
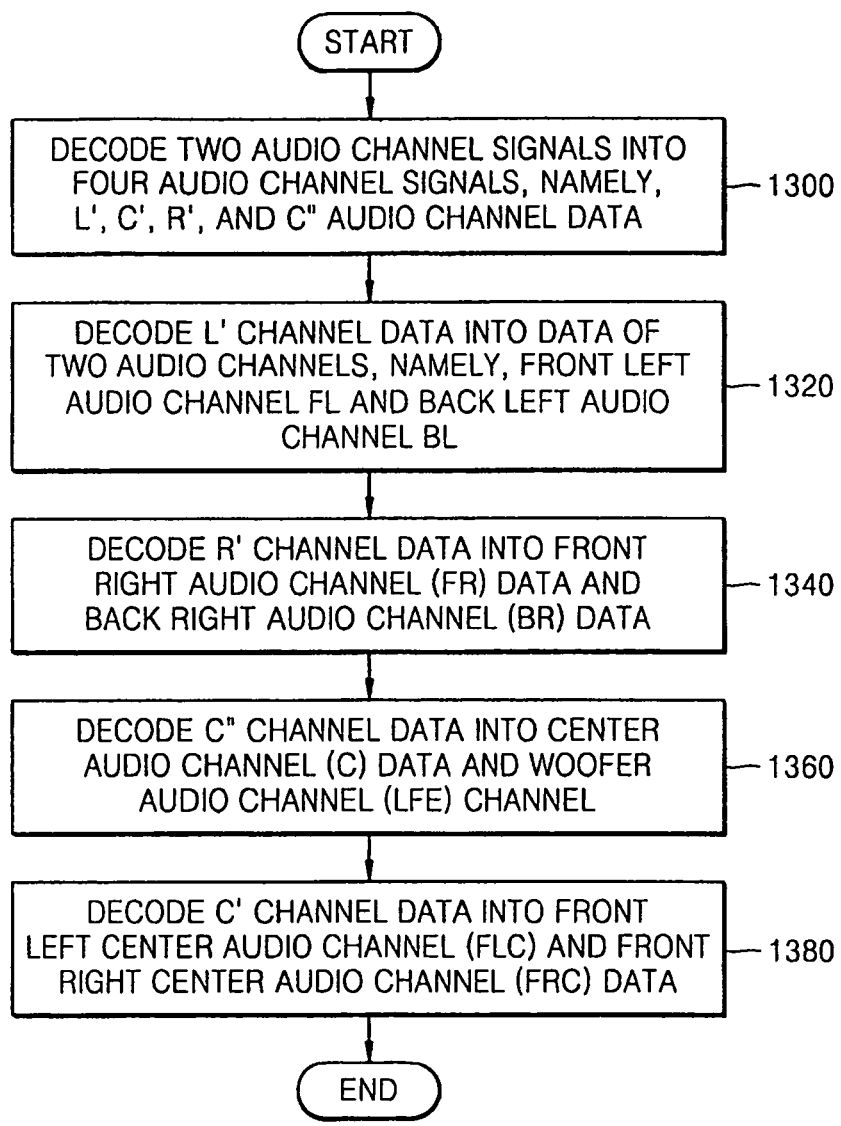
FIG. 13 illustrates a multi-channel audio signal decoding method, according to an embodiment of the present invention.

FIG. 13 illustrates a multi-channel audio signal decoding method, according to an embodiment of the present invention. In operation 1300, a bitstream including two audio channel signals, e.g., a first audio channel signal and a second audio channel signal, and space information that may includes information about magnitude differences between the channels and similarities therebetween, during the corresponding encoding of the channels, is decoded so that the first audio channel signal_is output as two audio channel signals, e.g., L' and C' audio channel signals. Here, L' and C' denote right and center audio channels, respectively. Also, in operation 1300, the bitstream may be decoded so that the second audio channel signal is output as two audio channel signals, e.g., R' and C" audio channel signals, with R' and C" denoting right and center audio channels, respectively.

In operation 1320, the L' signal obtained in operation 1300 may be decoded into signals of the front left audio channel FL and the back left audio channel BL.

In operation 1340, the first channel signal may be decoded into the front right audio channel (FR) signal and the back right audio channel (BR) signal. In operation 1360, the second channel (C") signal may be decoded into the center audio channel (C) signal and the woofer audio channel (LFE) signal. Further, in operation 1380, the C" channel signal obtained in operation 1300 may be decoded into the front left center audio channel (FLC) and the front right center audio channel (FRC) signal.

In this embodiment, to achieve the selective decoding of the bitstream into a predetermined number of audio channel signals, decoding level information generated by a decoder may be used so that audio channel signals are output based on the decoding levels. The decoding level information may include the first decoding level dl0, which may be used during the selective decoding of the bitstream including two audio channel signals into two audio channel signals, the second decoding level dl1, which may be used during the selective decoding of the two audio channel signals output at the first decoding level dl0 into signals of the four audio channels L', R', C', and C", the third decoding level dl2, which may be used during the selective decoding of the L' audio channel signal into the FL and BL audio channel signals, the R' audio channel signal into the FR and BR audio channel signals, and the C" audio channel signal into the C and LFE audio channel signals, and the fourth decoding level dl3, which may be used during the selective decoding of the C'channel signal into the FLC and FRC audio channel signals.

In above embodiments, time domain temporal shaping (TP) and temporal envelope shaping (TES) may be used to obtain intermediate outputs. In addition, each of the decoding levels may be greater than a tree depth. For example, MPEG surround data encoded in five channels may be decoded to be played back by 7 speakers that establish a tree structure.

Figure 14:
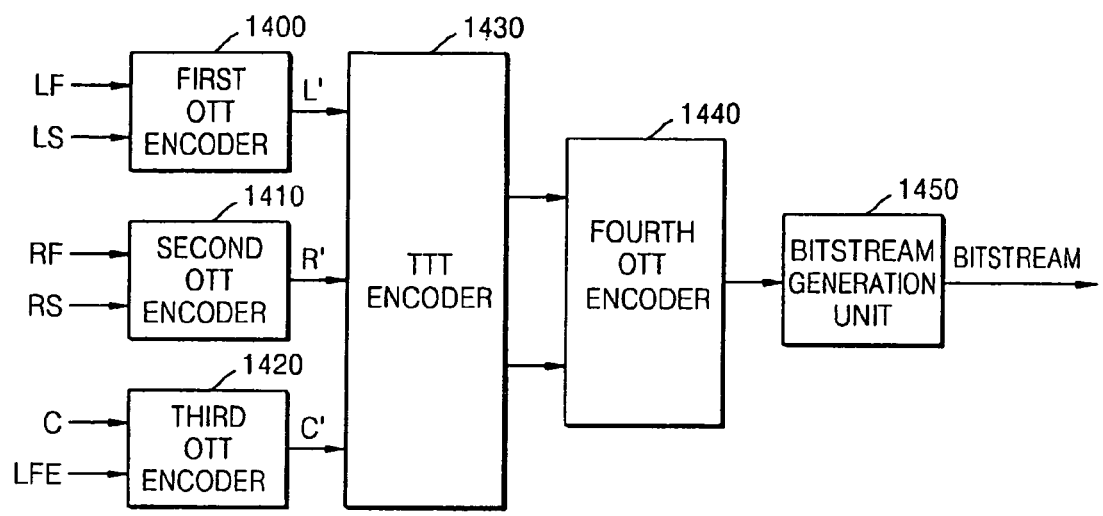
FIG. 14 illustrates a multi-channel audio signal encoding system, according to an embodiment of the present invention.

In accordance with the above, a system, medium, and method of encoding such a multi-channel audio signal, according to an embodiment of present invention will now be further described. FIG. 14 illustrates a multi-channel audio signal encoding system, according to an embodiment of the present invention, and may include a first OTT encoder 1400, a second OTT encoder 1410, a third OTT encoder 1420, a TTT encoder 1430, a fourth OTT encoder 1440, and a bitstream generation unit 1450, for example.

The first OTT encoder 1400 may generate a first OTT audio channel (L') signal and a first OTT parameter (also potentially called space information or spatial cues) that may include information about magnitude differences and similarities between the corresponding channels, using a left front audio channel (LF) signal and a left surround audio channel (LS) signal. The second OTT encoder 1410 may generate a second OTT audio channel (R') signal and a second OTT parameter that may include magnitude differences between the corresponding channels and information about similarities between the corresponding channels, using a right front audio channel (RF) signal and a right surround audio channel (RS) signal.

The third OTT encoder 1420 may generate a third OTT audio channel (C') signal and a third OTT parameter that may include magnitude differences between magnitudes of channels and information about similarities between the corresponding channels, using a center audio channel (C) signal and a woofer audio channel (LFE) signal. In addition, the TTT encoder 1430 may generate a TTT audio channel signal and a TTT parameter that may include a magnitude difference between the corresponding channels and information about similarities between the corresponding channels, using the L', R', and C' channel signals outputs by the first, second, and third OTT encoders 1400, 1410, and 1420, respectively.

The fourth OTT encoder 1440 may generate a fourth OTT audio channel signal and a fourth OTT parameter that may include a magnitude difference between the corresponding channels and information about similarities between the corresponding channels, using the TTT audio channel signal output by the TTT encoder 1430. The bitstream generation unit 1450 may then compresses the OTT parameters produced by the first through fourth OTT encoders 1440, 1410, 1420, and 1440, the TTT parameter produced by the TTT encoder 1430, and the audio signal produced by the fourth OTT encoder 1440 so as to generate a bitstream that can be later decoded based upon such encoded audio signal and the compressed parameter information.

Figure 15:
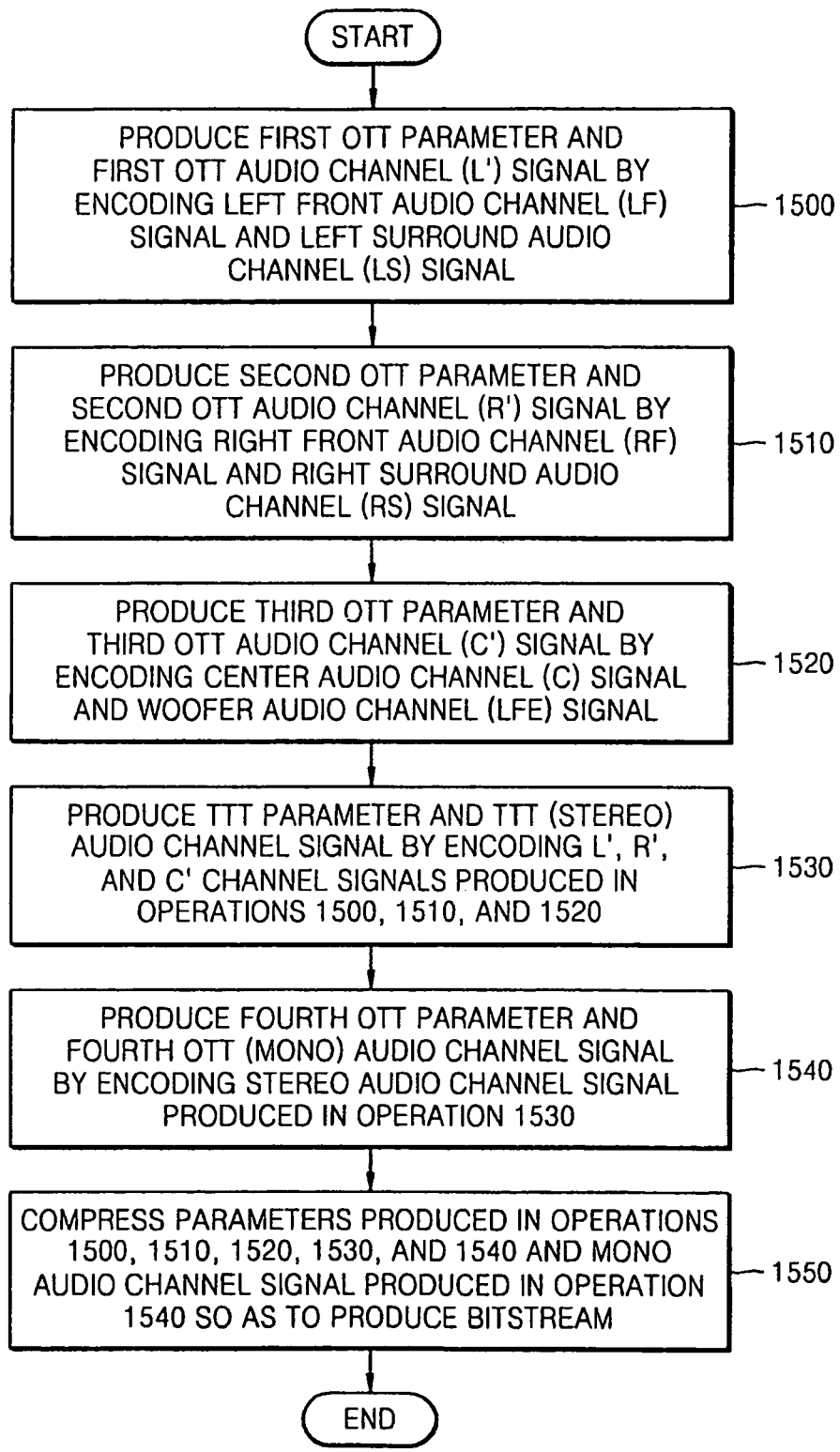
FIG. 15 illustrates a multi-channel audio signal encoding method, according to an embodiment of the present invention.

FIG. 15 illustrates a multi-channel audio signal encoding method, according to an embodiment of the present invention. In operation 1500, the first OTT parameter and the first OTT audio channel (L') signal may be generated from the left front audio channel (LF) signal and the left surround audio channel (LS) signal.

In operation 1510, the second OTT parameter and the second OTT audio channel (R') signal may be generated from the right front audio channel (RF) signal and the right surround audio channel (RS) signal.

In operation 1520, the third OTT parameter and the third OTT audio channel (C') signal may be generated from the center audio channel (C) signal and the woofer audio channel (LFE) signal.

In operation 1530, the TTT parameter and the TTT (stereo) audio channel signal may further be generated from the L', R', and C' channel signals generated in operations 1500, 1510, and 1520, respectively.

In operation 1540, the fourth OTT parameter and the fourth OTT (downmixed-mono) audio channel signal may be generated from the stereo audio channel signal generated in operation 1530.

In operation 1550, the parameters generated in operations 1500, 1510, 1520, 1530, and 1540 and the mono-downmixed audio channel signal produced in operation 1540 are compressed to generate the bitstream.

Figure 16:
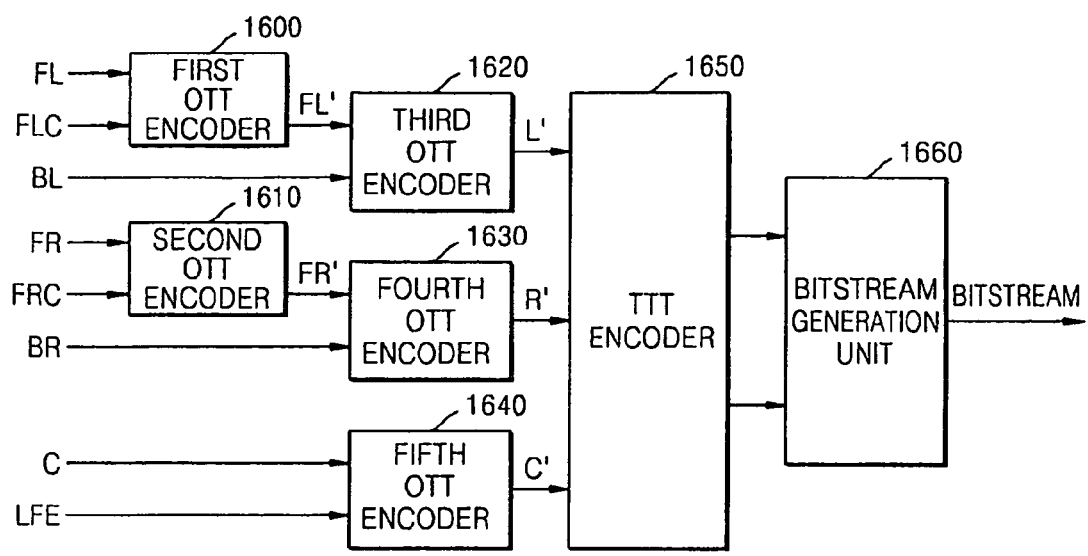
FIG. 16 illustrates a multi-channel audio signal encoding system, according to another embodiment of the present invention.

FIG. 16 illustrates a multi-channel audio signal encoding system, according to an embodiment of the present invention, which may include a first OTT encoder 1600, a second OTT encoder 1610, a third OTT encoder 1620, a fourth OTT encoder 1630, a fifth OTT encoder 1640, a TTT encoder 1650, and a bitstream generation unit 1660, for example.

The first OTT encoder 1600 may generate a first OTT audio channel (FL') signal and a first OTT parameter that may include information about magnitude differences and similarities between the corresponding channels, using a front left audio channel (FL) signal and a front left center audio channel (FLC) signal. The second OTT encoder 1610 may generate a second OTT audio channel (FR') signal and a second OTT parameter that may include information about magnitude differences and similarities between the corresponding channels, using a front right audio channel (FR) signal and a front right center audio channel (FRC) signal. The third OTT encoder 1620 may further generate a third OTT audio channel (L') signal and a third OTT parameter that may include information about magnitude differences and similarities between the corresponding channels, using the FL' audio channel signal produced by the first OTT encoder 1600 and a back left audio channel (BL) signal.

The fourth OTT encoder 1630 may generate a fourth OTT audio channel (R') signal and a fourth OTT parameter that may include information about magnitude differences and similarities between the corresponding channels, using the FR' audio channel signal produced by the second OTT encoder 1630 and a back right audio channel (BR) signal. The fifth OTT encoder 1640 may generate a fifth OTT audio channel (C') signal and a fifth OTT parameter that may include information about magnitude differences and similarities between the corresponding channels, using a center audio channel (C) signal and a woofer audio channel (LFE) signal.

The TTT encoder 1650 may generate a TTT audio channel signal and a TTT parameter that may include a difference between the magnitudes of channels and information about the similarities between the corresponding channels, using the L', R', and C' channel signals output by the third, fourth, and fifth OTT encoders 1620, 1630, and 1640, respectively.

The bitstream generation unit 1660 may then compresses the parameters generated by the first through fifth OTT encoders 1600 through 1640 and the TTT encoder 1650 and the TTT audio signal generated by the TTT encoder 1650 so as to produce a bitstream.

Figure 17:
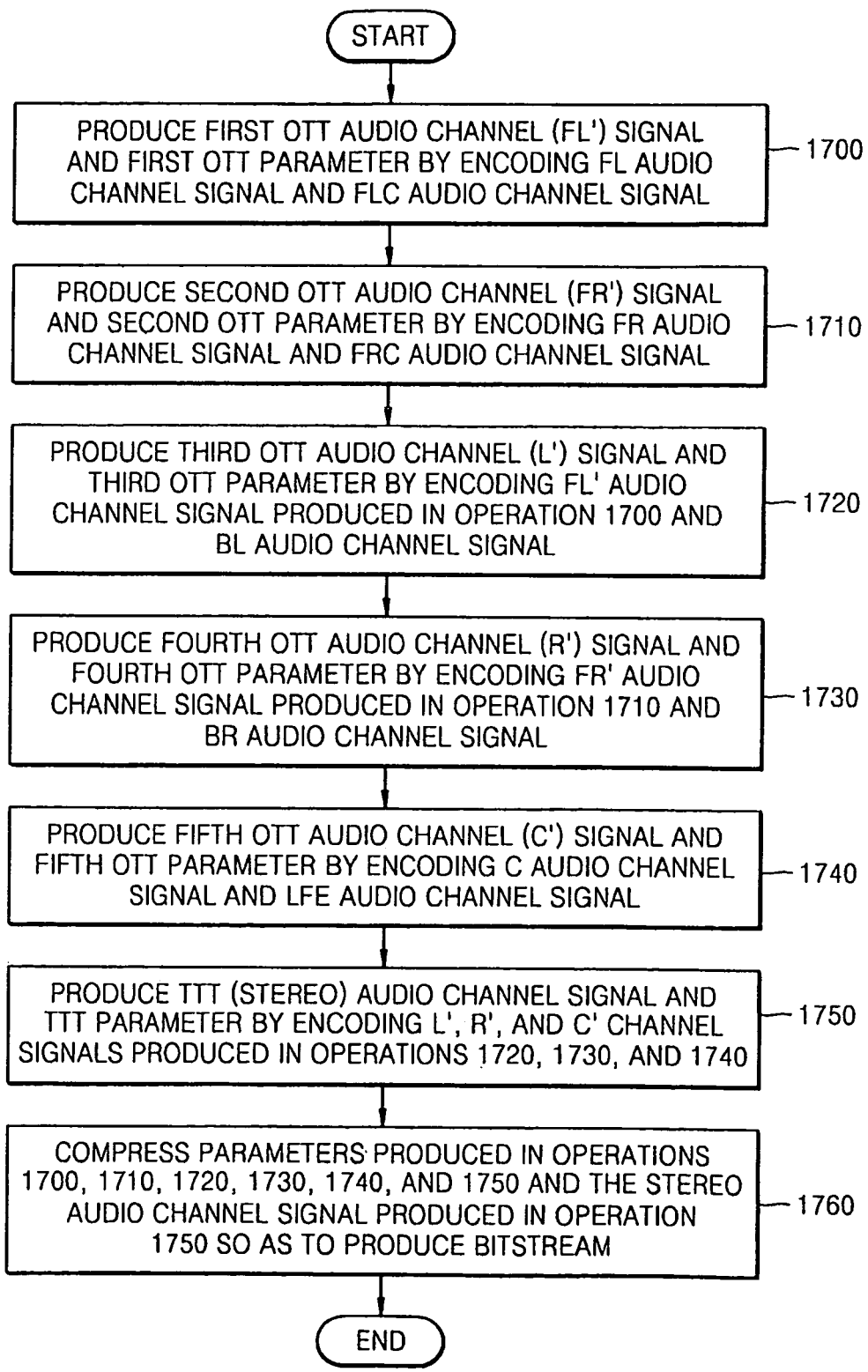
FIG. 17 illustrates a multi-channel audio signal encoding method, according to an embodiment of the present invention.

FIG. 17 illustrates a multi-channel audio signal encoding method, according to an embodiment of the present invention. In operation 1700, the first OTT audio channel (FL') signal and the first OTT parameter may be generated from the FL audio channel signal and the FLC audio channel signal. In operation 1710, the second OTT audio channel (FR') signal and the second OTT parameter may be generated from the FR audio channel signal and the FRC audio channel signal.

In operation 1720, the third OTT audio channel (L') signal and the third OTT parameter may be generated using the FL' audio channel signal generated in operation 1700 and the BL audio channel signal. Further, in operation 1730, the fourth OTT audio channel (R') signal and the fourth OTT parameter may be generated from the FR' audio channel signal generated in operation 1710 and the BR audio channel signal.

In operation 1740, the fifth OTT audio channel (C') signal and the fifth OTT parameter may be generated from the C audio channel signal and the LFE audio channel signal. In operation 1750, the TTT (stereo) audio channel signal and the TTT parameter may be generated from the L', R', and C' channel signals produced in operations 1720, 1730, and 1740, respectively. In operation 1760, the parameters generated in operations 1700, 1710, 1720, 1730, 1740, and 1750 and the stereo audio channel signal generated in operation 1750 may then be compressed so as to generate a corresponding bitstream.

Figure 18:
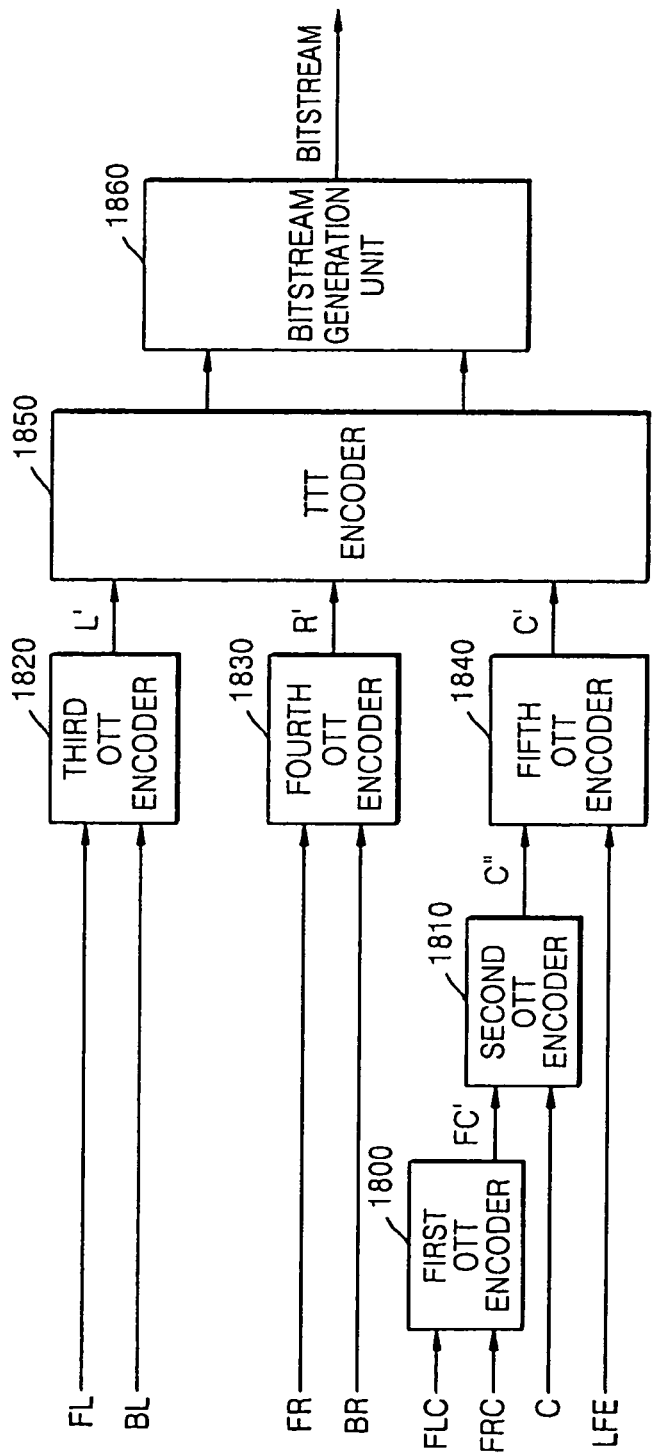
FIG. 18 illustrates a multi-channel audio signal encoding system, according to another embodiment of the present invention.

FIG. 18 illustrates a multi-channel audio signal encoding system, according to an embodiment of the present invention, which may include a first OTT encoder 1800, a second OTT encoder 1810, a third OTT encoder 1820, a fourth OTT encoder 1830, a fifth OTT encoder 1840, a TTT encoder 1850, and a bitstream generation unit 1860, for example.

The first OTT encoder 1800 may generate a first OTT audio channel (FC') signal and a first OTT parameter that may include information about magnitude differences and similarities between corresponding channels, using a front left center audio channel (FLC) signal and a front right center audio channel (FRC) signal. The second OTT encoder 1810 may generate a second OTT audio channel (C'') signal and a second OTT parameter that may include a difference between the magnitudes of corresponding channels and information about similarities between the corresponding channels, using the FC' audio channel signal output by the first OTT encoder 1800 and a center audio channel (C) signal.

The third OTT encoder 1820 may generate a third OTT audio channel (L') signal and a third OTT parameter that may include information about magnitude differences and similarities between the corresponding channels, using a front left audio channel (FL) signal and a back left audio channel (BL) signal. The fourth OTT encoder 1830 may generate a fourth OTT audio channel (R') signal and a fourth OTT parameter that may include information about magnitude differences and similarities between the corresponding channels, using an FR audio channel signal and a back right audio channel (BR) signal. The fifth OTT encoder 1840 may generate a fifth OTT audio channel (C') signal and a fifth OTT parameter that may include information about magnitude differences and similarities between the corresponding channels, using the C'' audio channel signal output by the second OTT encoder 1810 and a woofer audio channel (LFE) signal.

The TTT encoder 1850 may generate a TTT audio channel signal and a TTT parameter that may include information about magnitude differences and similarities between the corresponding channels, using the L', R', and C' channel signals output by the third, fourth, and fifth OTT encoders 1820, 1830, and 1840, respectively. The bitstream generation unit 1860 may then compress the parameters generated by the first through fifth OTT encoders 1800 through 1840 and the TTT encoder 1850 and the TTT audio channel signal generated by the TTT encoder 1850 so as to generate a bitstream.

Figure 19:
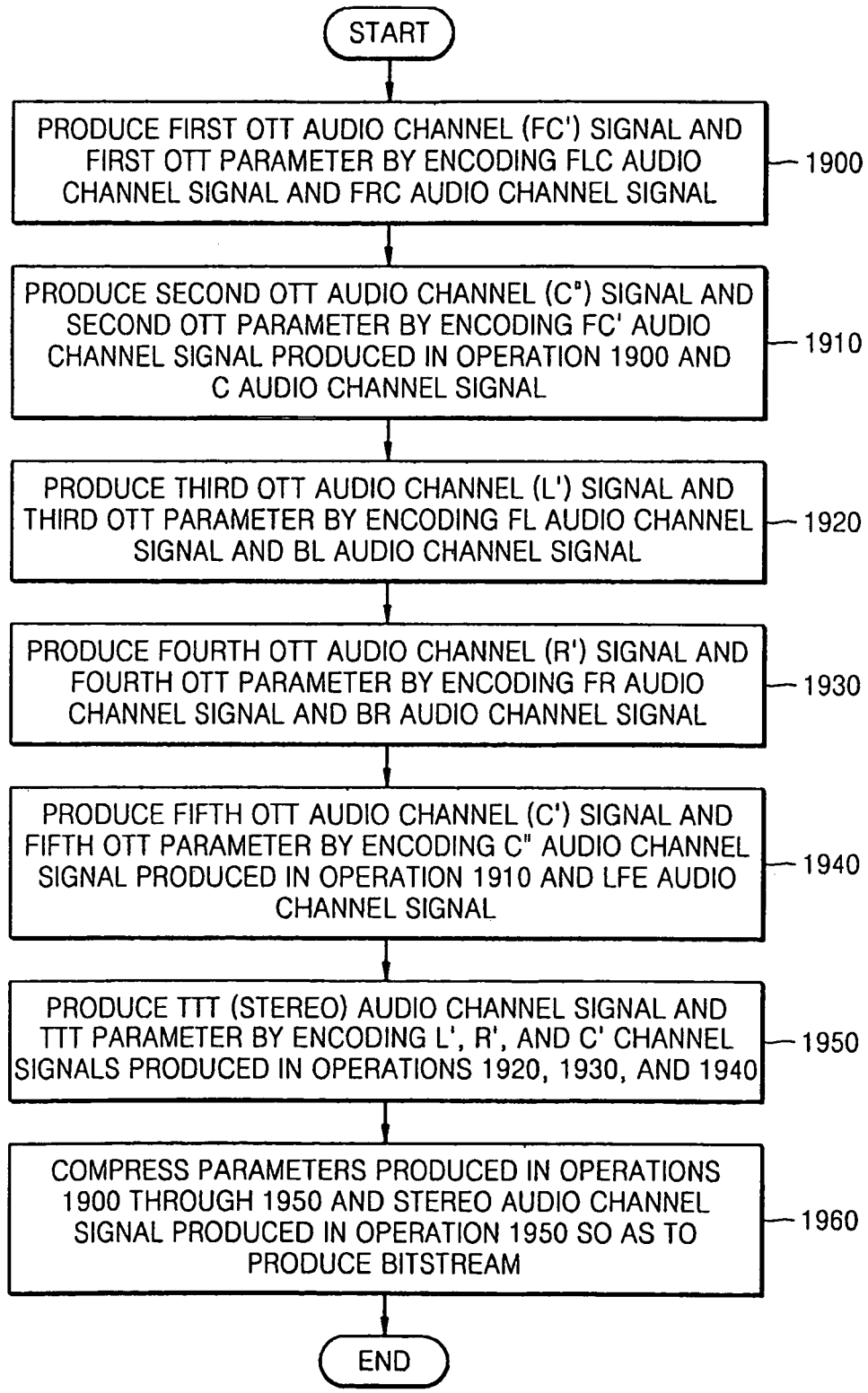
FIG. 19 illustrates a multi-channel audio signal encoding method, according to another embodiment of the present invention.

FIG. 19 illustrates a multi-channel audio signal encoding method, according to an embodiment of the present invention. In operation 1900, the first OTT audio channel (FC') signal and the first OTT parameter may be generated from the FLC audio channel signal and the FRC audio channel signal. In operation 1910, the second OTT audio channel (C'') signal and the second OTT parameter may be generated from the FC' audio channel signal produced in operation 1900 and the C audio channel signal. In operation 1920, the third OTT audio channel (L') signal and the third OTT parameter may be generated from the FL audio channel signal and the BL audio channel signal.

In operation 1930, the fourth OTT audio channel (R') signal and the fourth OTT parameter may be generated from the FR audio channel signal and the BR audio channel signal. In operation 1940, the fifth OTT audio channel (C') signal and the fifth OTT parameter may be generated from the C'' audio channel signal generated in operation 1910 and the LFE audio channel signal. In operation 1950, the TTT (stereo) audio channel signal and the TTT parameter may be generated from the L', R', and C' channel signals generated in operations 1920, 1930, and 1940, respectively. In operation 1960, the parameters generated in operations 1900 through 1950 and the stereo audio channel signal generated in operation 1950 may be compressed so as to generate a bitstream.

Figure 20:
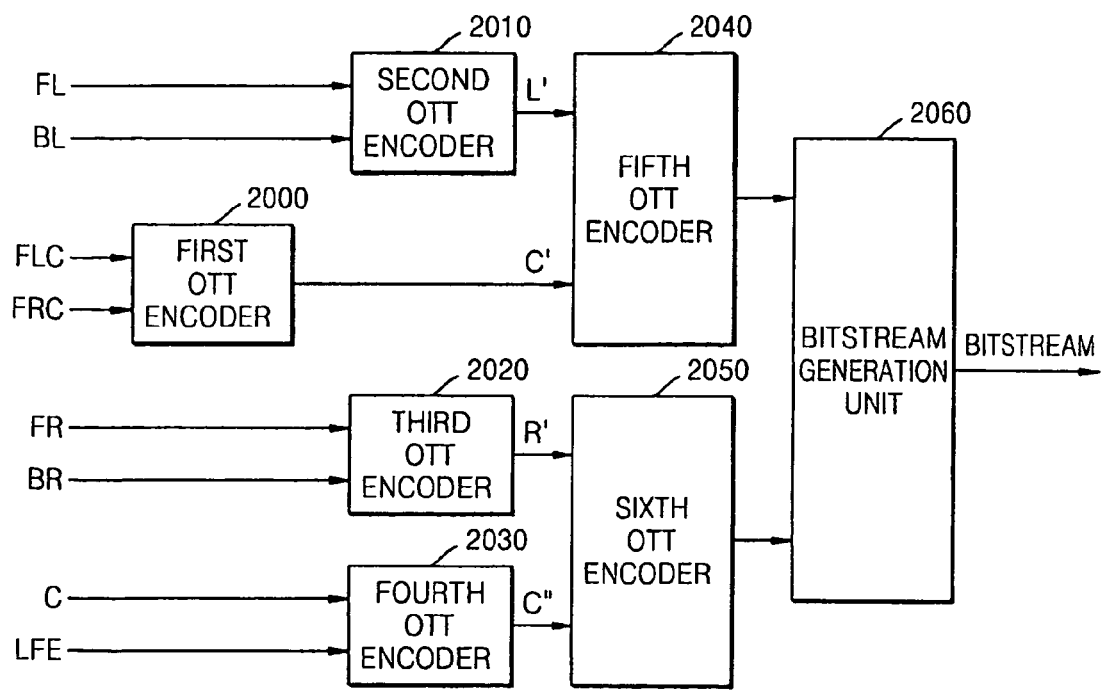
FIG. 20 illustrates a multi-channel audio signal encoding system, according to still another embodiment of the present invention.

FIG. 20 illustrates a multi-channel audio signal encoding system, according to an embodiment of the present invention, which may include a first OTT encoder 2000, a second OTT encoder 2010, a third OTT encoder 2020, a fourth OTT encoder 2030, a fifth OTT encoder 2040, a sixth OTT encoder 2050, and a bitstream generation unit 2060, for example.

The first OTT encoder 2000 may generate a first OTT audio channel (C') signal and a first OTT parameter that may include information about magnitude differences and similarities between the corresponding channels, using a front left center audio channel (FLC) signal and a front right center audio channel (FRC) signal. The second OTT encoder 2010 may generate a second OTT audio channel (L') signal and a second OTT parameter that may include information about magnitude differences and similarities between the corresponding channels, using a front left audio channel (FL) signal and a back left audio channel (BL) signal. The third OTT encoder 2020 may generate a third OTT audio channel (R') signal and a third OTT parameter that may include information about magnitude differences and similarities between the corresponding channels, using a front right audio channel (FR) signal and a back right audio channel (BR) signal.

The fourth OTT encoder 2030 may generate a fourth OTT audio channel (C'') signal and a fourth OTT parameter that may include information about magnitude differences and similarities between the corresponding channels, using a center audio channel (C) signal and a woofer audio channel (LFE) signal. The fifth OTT encoder 2040 may generate a fifth OTT audio channel signal and a fifth OTT parameter that may include information about magnitude differences and similarities between the corresponding channels, using the L' audio channel signal output by the second OTT encoder 2010 and the C' audio channel signal output by the first OTT encoder 2000. The sixth OTT encoder 2050 may generate a sixth OTT audio channel signal and a sixth OTT parameter that may include information about magnitude differences and similarities between the corresponding channels, using the R' audio channel signal output by the third. OTT encoders 2020 and the C'' audio channel signal output by the fourth OTT encoder 2030.

The bitstream generation unit 2060 may then compress the parameters generated by the first through sixth OTT encoders 2000 through 2050, the fifth OTT audio channel signal generated by the fifth OTT encoder 2040, and the sixth OTT audio channel signal generated by the sixth OTT encoder 2060, so as to generate a bitstream.

Figure 21:
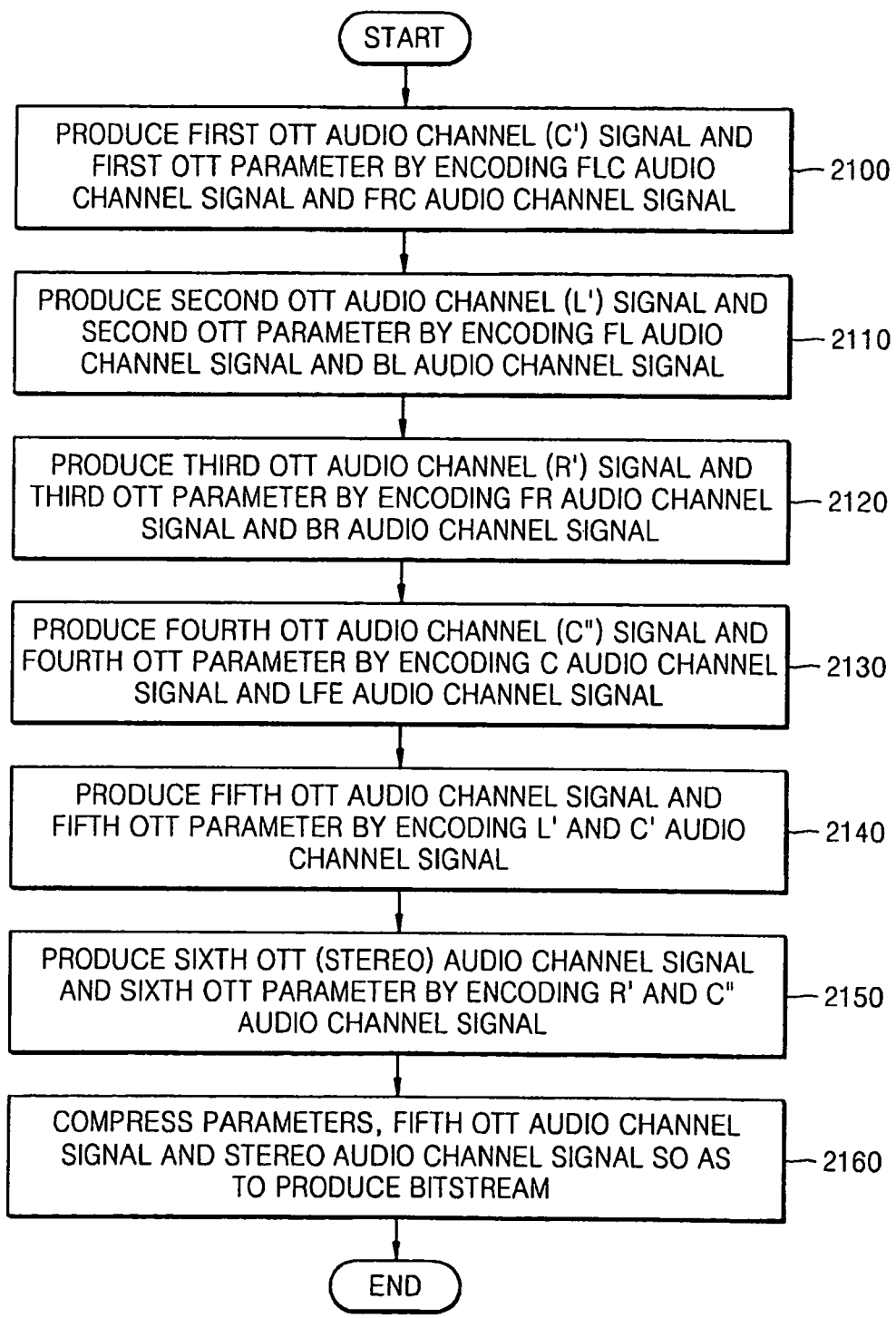
FIG. 21 illustrates a multi-channel audio signal encoding method, according to another embodiment of the present invention.

FIG. 21 illustrates a multi-channel audio signal encoding method, according to an embodiment of the present invention. In operation 2100, the first OTT audio channel (C') signal and the first OTT parameter may be generated from the FLC audio channel signal and the FRC audio channel signal. In operation 2110, the second OTT audio channel (L') signal and the second OTT parameter may be generated from the FL audio channel signal and the BL audio channel signal. In operation 2120, the third OTT audio channel (R') signal and the third OTT parameter may be generated from the FR audio channel signal and the BR audio channel signal. In operation 2130, the fourth OTT audio channel (C'') signal and the fourth OTT parameter may be generated from the C audio channel signal and the LFE audio channel signal.

In operation 2140, the fifth OTT audio channel signal and the fifth OTT parameter may be generated from the L' audio channel signal generated in operation 2110 and the C' audio channel signal generated in operation 2100. In operation 2150, the sixth OTT (stereo) audio channel signal and the sixth OTT parameter may be generated from the R' audio channel signal produced in operation 2120 and the C" audio channel signal generated in operation 2130. In operation 2160, the parameters generated in operations 2100 through 2140, the fifth OTT audio channel signal generated in operation 2140, and the stereo audio channel signal generated in operation 2150 may be compressed to generate a bitstream.

In a system, medium, and method of encoding/decoding a multi-channel audio signal, according to an embodiment of the present invention, even a single input bitstream can be decoded into audio channel signals of a suitable number of channels based on the type of a speaker configuration used and/or decoding level information. Thus, scalable channel decoding can be achieved by partially and selectively decoding an input bitstream. In such scalable channel decoding, a decoder may set decoding levels and output audio channel signals based on the decoding levels, thereby decreasing decoding complexity.

In addition to the above described embodiments, embodiments of the present invention can also be implemented through computer readable code/instructions in/on a medium, e.g., a computer readable medium, to control at least one processing element to implement any above described embodiment. The medium can correspond to any medium/media permitting the storing and/or transmission of the computer readable code.

The computer readable code can be recorded/transferred on a medium in a variety of ways, with examples of the medium including magnetic storage media (e.g., ROM, floppy disks, hard disks, etc.), optical recording media (e.g., CD-ROMs, or DVDs), and storage/transmission media such as carrier waves, as well as through the Internet, for example. Here, the medium may further be a signal, such as a resultant signal or bitstream, according to embodiments of the present invention. The media may also be a distributed network, so that the computer readable code is stored/transferred and executed in a distributed fashion. Still further, as only an example, the processing element could include a processor or a computer processor, and processing elements may be distributed and/or included in a single device.

In addition to the above, though embodiments have been explained in view of systems, the corresponding embodiments can equally be implemented in apparatuses.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A multi-channel audio signal decoding system, comprising:
   a two-to-three decoder to decode two audio channel signals and using TTT spatial information into first, second, and third channel signals;
   a first one-to-two (OTT) decoder to decode the first channel signal using first OTT spatial information into first plural channel signals;
   a second OTT decoder to decode the second channel signal using second OTT spatial information into second plural channel signals;
   a third OTT decoder to decode the third channel signal using third OTT spatial information into third plural channel signals;
   a fourth OTT decoder to decode one of the first plural channel signals output by the first OTT decoder using fourth OTT spatial information into fourth plural channel signals; and
   a fifth OTT decoder to decode one of the second plural channel signals output by the second OTT decoder using fifth OTT spatial information into fifth plural channel signals,
   wherein all of the decoders are arranged by a tree-structure.

2. The multi-channel audio signal decoding system of claim 1, wherein:
   the three audio channel signals output by the TTT decoder correspond to a left audio channel L', a right audio channel R', and a center audio channel C', respectively;
   the first plural channel signals output by the first OTT decoder correspond to a front left audio channel FL' and a back left audio channel BL, respectively;
   the second plural channel signals output by the second OTT decoder correspond to a front right audio channel FR' and a back right audio channel BR, respectively;
   the third plural channel signals output in the third OTT decoding correspond to a center audio channel C" and an LFE audio channel, respectively;
   the fourth plural channel signals output by the fourth OTT decoder correspond to a front left audio channel FL and a front left center audio channel FLC, respectively; and
   the fifth plural channel signals output by the fifth OTT decoder correspond to a front right audio channel FR and a front right center audio channel FRC, respectively.

3. The multi-channel audio signal decoding system of claim 1, wherein the decoding system selectively decodes the bitstream based on decoding levels of at least the TTT decoder and collective decoding of the three audio channel signals, respectively.

4. The multi-channel audio signal decoding system of claim 1, further comprising a decoding level generation unit to generate decoding-level information to control decoding levels of the bitstream into a number of audio channel signals.

5. The multi-channel audio signal decoding system of claim 2, wherein the decoding level information comprises:
   a first decoding level to control decoding of the bitstream including the two encoded audio channel signals into the two audio channel signals;
   a second decoding level to control decoding of the two audio channel signals output at the first decoding level into the three audio channel signals corresponding to three audio channels L', R', and C', respectively;
   a third decoding level to control decoding of the three audio channel signals output at the second decoding level into signals of 5.1 audio channels FL', BL, FR', BR, C, and LFE; and
   a fourth decoding level to control decoding of one channel FL' signal into signals corresponding to audio channel FL and FLC and the another channel FR' signal into signals corresponding to audio channels FR and FRC so that a total of 7.1 channel signals are generated.

* * * * *

UNITED STATES PATENT AND TRADEMARK OFFICE
CERTIFICATE OF CORRECTION

PATENT NO. : 8,812,141 B2  
APPLICATION NO. : 13/137292  
DATED : August 19, 2014  
INVENTOR(S) : Junghoe Kim et al.

Page 1 of 1

It is certified that error appears in the above-identified patent and that said Letters Patent is hereby corrected as shown below:

On the Title Page

Item [54] and in the Specification, Column 1, line 1 (Title), delete "MEDIUM" and insert -- MEDIUM, --, therefor.
Item [75] (Inventors), line 1, delete "Junghee Kim" and insert -- Junghoe Kim --, therefor.
Item [75] (Inventors), line 1, delete "Mino Lei" and insert -- Miao Lei --, therefor.
Item [57] (Abstract), line 1, delete "An system, method," and insert -- A system, medium, --, therefor.

In the Claims

Column 23, line 58, in Claim 1, after "a two-to-three", insert -- (TTT) --, therefor.
Column 23, line 59, in Claim 1, before "using", delete "and", therefor.
Column 24, line 42, in Claim 4, delete "claim 1," and insert -- claim 3, --, therefor.
Column 24, line 46, in Claim 5, delete "claim 2," and insert -- claim 4, --, therefor.

Signed and Sealed this  
Fifth Day of May, 2015

Michelle K. Lee  
*Director of the United States Patent and Trademark Office*